US011854890B2

(12) United States Patent
Krach et al.

(10) Patent No.: US 11,854,890 B2
(45) Date of Patent: Dec. 26, 2023

(54) CAPACITOR AND METHOD FOR PRODUCING THE SAME

(71) Applicants: Fraunhofer-Gesellschaft zur Foerderung der angewandten Forschung e.V., Munich (DE); Friedrich-Alexander-Universitaet Erlangen-Nuernberg, Erlangen (DE)

(72) Inventors: Florian Krach, Nuremberg (DE); Tobias Erlbacher, Poxdorf (DE)

(73) Assignees: Fraunhofer-Gesellschaft zur Foerderung der angewandten Forschung e.V., Munich (DE); Friedrich-Alexander-Universitaet Erlangen-Nuernberg, Erlangen (DE)

( * ) Notice: Subject to any disclaimer, the term of this patent is extended or adjusted under 35 U.S.C. 154(b) by 88 days.

(21) Appl. No.: 17/188,742

(22) Filed: Mar. 1, 2021

(65) Prior Publication Data

US 2021/0210386 A1    Jul. 8, 2021

Related U.S. Application Data

(62) Division of application No. 14/951,337, filed on Nov. 24, 2015, now Pat. No. 10,937,696.

(30) Foreign Application Priority Data

Nov. 24, 2014    (DJ) .......................... 102014223904.4

(51) Int. Cl.
*H01L 29/92*    (2006.01)
*H01L 21/78*    (2006.01)
(Continued)

(52) U.S. Cl.
CPC ........ *H01L 21/78* (2013.01); *H01L 29/66181* (2013.01); *H01L 29/945* (2013.01); *H01L 27/0694* (2013.01)

(58) Field of Classification Search
CPC ....... H01L 23/48; H01L 21/02; H01L 21/768; H01L 21/70; H01L 27/108;
(Continued)

(56) References Cited

U.S. PATENT DOCUMENTS 7,738,226 B2    6/2010    Berberich et al.
8,487,405 B2    7/2013    Tian et al.
(Continued)

FOREIGN PATENT DOCUMENTS

CN    1542943 A    *  11/2004
EP    1535338 A2       6/2005
(Continued)

OTHER PUBLICATIONS

U.S. Department of Commerce, National Bureau of Standards, Miscellaneous Publications Nos. 286-288, p. 3 (Year: 1967).*
(Continued)

*Primary Examiner* — Samuel Park
(74) *Attorney, Agent, or Firm* — Perkins Coie LLP; Michael A. Glenn

(57) ABSTRACT

In a method for producing a capacitor, a dielectric structure is generated in a trench of a semiconductor substrate. The dielectric structure includes a plurality of adjacent dielectric layers having opposing material tensions.

18 Claims, 11 Drawing Sheets

Figure 1:
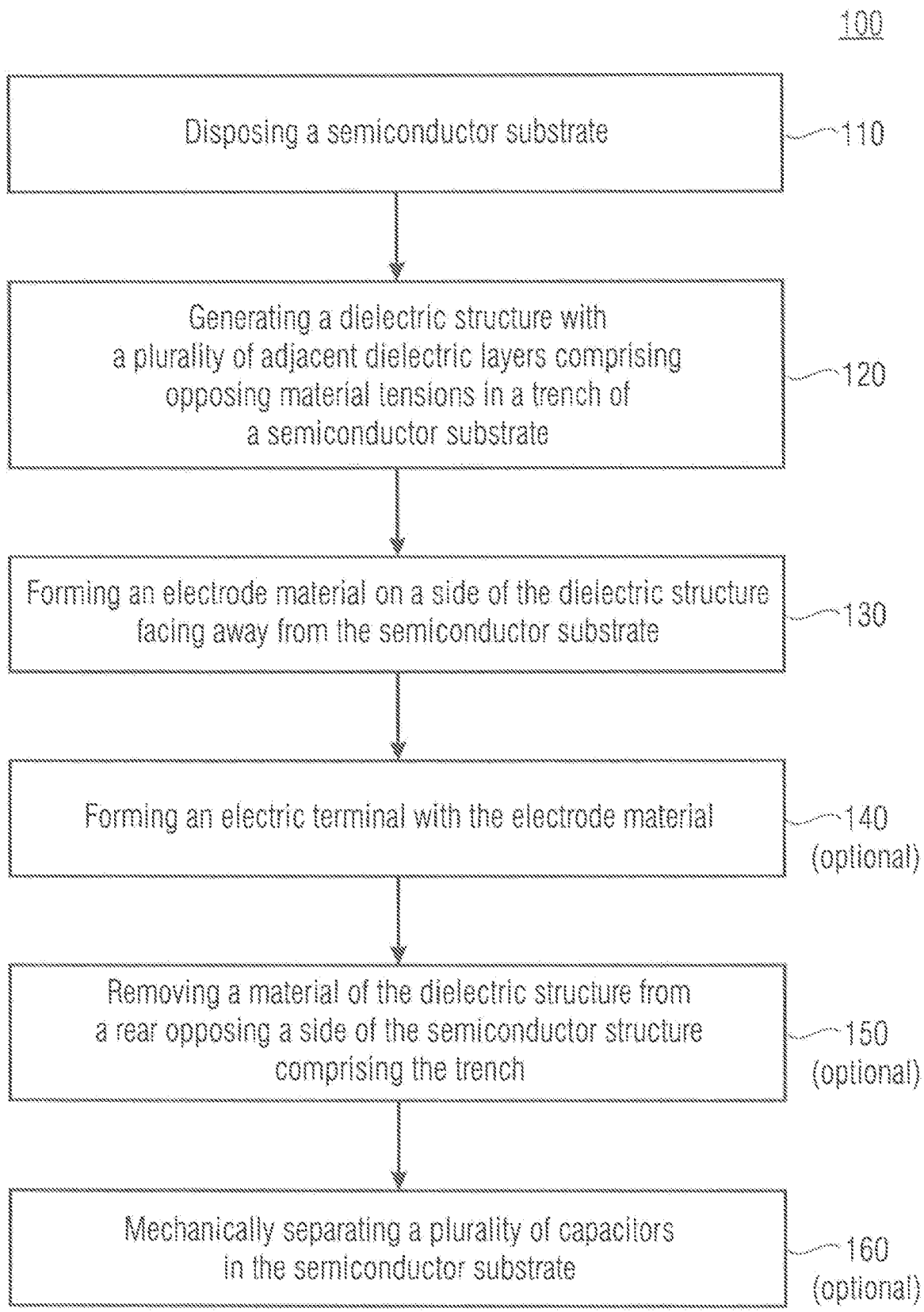

(51) Int. Cl.
*H01L 29/66* (2006.01)
*H01L 29/94* (2006.01)
*H01L 27/06* (2006.01)

(58) Field of Classification Search
CPC ..... H01L 21/8242; H01L 29/92; H01L 21/78; H01L 29/66181; H01L 29/945; H01L 27/0694; H01L 2924/0002; H01L 21/76898; H01L 23/481; H01L 21/76831; H01L 2225/06541; H01L 27/10829; H01L 25/0657; H01L 27/10867
See application file for complete search history.

(56) References Cited

U.S. PATENT DOCUMENTS

| | | | |
|---|---|---|---|
| 2006/0022242 | A1 | 2/2006 | Sugatani et al. |
| 2006/0275974 | A1* | 12/2006 | Kwon ................ H10B 12/0387 438/209 |
| 2008/0099831 | A1* | 5/2008 | Mizukoshi ........ H01L 29/66833 257/E21.21 |
| 2008/0230822 | A1 | 9/2008 | Cheng et al. |
| 2008/0316675 | A1 | 12/2008 | Hintze et al. |
| 2009/0146760 | A1* | 6/2009 | Reefman ............ H01L 23/3128 333/184 |
| 2010/0006979 | A1 | 1/2010 | Krutsick et al. |
| 2010/0237502 | A1 | 9/2010 | Yu |
| 2010/0326702 | A1 | 12/2010 | Dang |
| 2011/0001217 | A1 | 1/2011 | Neuilly et al. |
| 2011/0020163 | A1* | 1/2011 | Nilen ...................... C22C 29/02 75/238 |
| 2012/0026807 | A1* | 2/2012 | Kim ......................... G11C 5/14 365/198 |
| 2012/0142076 | A1* | 6/2012 | Bongiorni ............ C12N 9/1205 435/222 |
| 2012/0252074 | A1* | 10/2012 | Zhang ............ C12Y 101/01307 435/254.11 |
| 2013/0168740 | A1 | 7/2013 | Chen et al. |
| 2014/0108846 | A1* | 4/2014 | Berke ........................ G06F 1/28 713/340 |
| 2014/0145300 | A1* | 5/2014 | Bhagavat ................ H01L 25/16 257/532 |
| 2014/0264911 | A1 | 9/2014 | Lin |
| 2014/0374879 | A1* | 12/2014 | Chen ...................... H01L 22/20 257/532 |
| 2016/0134312 | A1* | 5/2016 | Kaczynski ............. H04B 1/109 455/249.1 |

FOREIGN PATENT DOCUMENTS

| | | |
|---|---|---|
| WO | 2004025731 A3 | 8/2004 |
| WO | 2009104132 A1 | 8/2009 |

OTHER PUBLICATIONS

Bunel, C., et al., "Silicon Capacitors with extremely high stability and reliability idea for high temperature applications", Additional Conferences (Device Packaging, HiTEC, HiTEN, & CICMT): vol. 2013, No. HiTEN, 4 pages.

Jacqueline, S. , et al., "Automotive Grade Silicon Capacitors for "Under the Hood" Applications", IPDiA_White Paper_Silicon Capacitors for Automotive_280414, 5 pages.

Krach, F., et al., "Silicon nitride, a high potential dielectric for 600V integrated RC-snubber applications", Journal of Vacuum Science & Technology B, 33(1), 01A112-1, pp. 1-7.

Laconte, J., et al., "Micromachined Thin-Film Sensors for SOI-CMOS Co-Integration", Springer Science & Business Media, Chapter 2, pp. 47-103.

Vom Dorp, Joachim, "Monolithisches RC-Element fur leistungelektronische Anwendungen Erlangung des Grades", Retrieved from the internet: hhttps://opus4.kobv.de/opus4-fau/files/1908/JoachimvomDorpDissertation.pdf on Feb. 19, 2016, pp. 75-77.

* cited by examiner

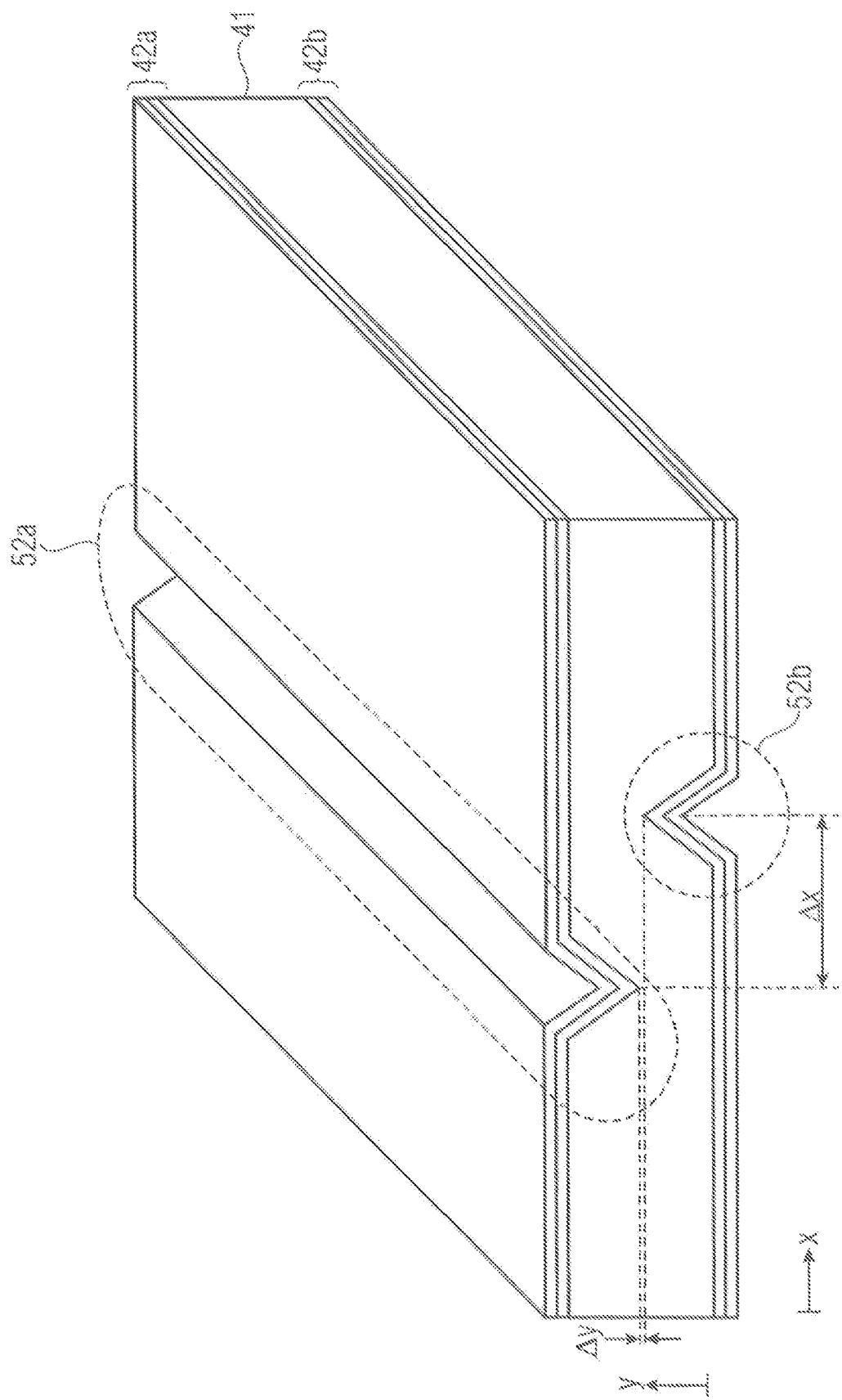

CAPACITOR AND METHOD FOR PRODUCING THE SAME

CROSS-REFERENCE TO RELATED APPLICATIONS

This application is a divisional application of German Patent Application No. 102014223904.4, filed Nov. 24, 2014, which application is incorporated by reference herein in its entirety.

DESCRIPTION

The present invention relates to a capacitor with a semiconductor substrate and to a method for producing the same. Further, the present invention relates to stress compensation in monolithic trench capacitors for power electronic applications for increasing the integration density.

Monolithic integrated capacitors and RC elements (R=resistor, C=capacitance) with operating voltages of 200 Volt or more, as known, for example, from U.S. Pat. No. 7,738,226 B2 are applied, for example, in power electronic circuits. Here, the same present an alternative for foil and ceramic capacitors and have advantages with respect to the same. Monolithic integrated capacitors are structured in circuits with the help of the same assembly and connection technology as it is used for active power switches (for example double diffused metal oxide semiconductor, DMOS, transistors and insulated gate bipolar transistors (IGBT) and diodes. Thereby, the assembly and connection technology of power modules is simplified. Here, the same also profit from a low-inductance connection and better heat dissipation compared to ceramic or foil capacitors. Due to the low-inductance assembly, the monolithically integrated capacitors allow a more efficient attenuation of vibrations. Additionally, their electric capacitance is subject to only low variations with the operating temperature and the same have a very predictable service life. Compared to ceramic capacitors having high integration density (so-called class 2 ceramics), these devices are characterized by high temperature, voltage and frequency stability.

Vom Dorp et al. "Dielectric Layers suitable for High Voltage Integrated Trench Capacitors", Journal of Vacuum Science and Technology B 29, 01ABO4 (2011) shows such capacitors as they are suitable for operating voltages up to 200 Volt. Here, a dielectric of 400 nm silicon dioxide or a dielectric of 20 nm silicon dioxide and 500 nm silicon nitride is used. The production process is also disclosed therein.

The monolithically integrated capacitors and RC elements are realized by metal insulator semiconductor (MIS) capacitors. For the stated voltage ranges, the usage of sufficiently thick dielectric layers having respective breakdown stability is necessitated. The dielectrics silicon nitride and silicon oxide have turned out to be suitable materials for this due to their high breakdown field strengths of more than 5 MV/cm or more than 10 MV/cm, respectively, their availability as regards to process technology and a high obtainable yield, i.e., a low defect density, such that the same are frequently selected as dielectric materials based on the obtainable dielectric strength of the produced capacitors. Specifically, thick silicon nitride layers are characterized by low leakage currents and high breakdown voltages.

As it is common in semiconductor technology, the costs per device increase approximately linearly to the increasing chip surface. Thus, for commercial usage, high integration density is necessitated due to the competition with foil and ceramic capacitors. Currently, this is realized by producing the capacitors with a limited surface enlargement. This surface enlargement V can be determined as follows:

$$V = \frac{A^*}{A_0} = \frac{C_{3D}}{\varepsilon_0 \varepsilon_{SiO_2}} d_{CET} = \frac{C_{3D}}{C_0}$$

Here, A* designates the effective area of the capacitors which results from the surface enlargement V. $A_0$ designates the planar area of the devices, i.e., the chip size. $C_{3D}$ designates the area-related capacitance of the 3D integrated capacitor. $C_0$ designates the area-related capacitance of a planar plate capacitor of the area $A_0$ with the same dielectric layers but without surface enlargement. DIET designates the effective electrically relevant layer thickness of the dielectric in relation to an equivalent silicon dioxide layer having a specific dielectric constant $\varepsilon_r$ of 3.9.

For obtaining surface enlargement that is as high as possible, the capacitors are produced on a semiconductor disk whose surface has been enlarged by three-dimensional structuring (usually on the entire surface). This structuring can be realized, for example, in the shape of deep holes. The surface enlargement is particularly influenced by diameter, distance and depth of the generated holes.

Thus, thick dielectric layers as necessitated for the desired dielectric strength have to be combined with a large effective surface of the capacitors. When producing such MIS capacitors, this results in a strong bending of the semiconductor disk resulting from the mechanical tensions (mechanical stress) in the layers and the underlying substrate. With increasing surface enlargement, bending of the disk increases so much that further processing (in particular after removing the layers from the rear of the semiconductor disk) is no longer possible due to the mechanical bending. Thus, bending of the semiconductor disk to that extent represents a barrier for introducing monolithically integrated capacitors and RC elements with high integration density for operating voltages of 600 Volt and more.

Basically, producing silicon capacitors is already known from the technology of dynamic random access memories (DRAM). However, only very thin dielectrics (up to 30 nm) and trenches having diameters in the sub-micrometer range are used there, since a dielectric strength of approximately 10 Volts must not be exceeded. In such thin dielectrics, bending of the semiconductor disk only occurs to a very limited extent.

Additionally, monolithically integrated capacitors are components of SONOS memory cells (SONOS=silicon oxide nitride oxide silicon) used as Flash memory, which comprise a dielectric stack of silicon dioxide, silicon nitride and silicon dioxide and are described, for example, in EP 1535338 A2. The dielectric strength of the dielectrics in such layers is, however, limited to below 30 Volt. Here, also, thin dielectrics up to a thickness of 30 nm are used where the bending of the semiconductor disk is of limited relevance for the producibility.

So far, monolithically integrated silicon capacitors with operating voltages up to 30 Volt and breakdown voltages up to maximum 100 Volt are known. So far, monolithically integrated capacitors having operating voltages in the range of 200 Volt and more are not available.

Integrated RC elements with 200 Volt nominal voltage, a capacitance of 15 nanofarad, a chip area of 10 mm² are known. For these 200 Volt devices, a layer stack of 20 nm silicon oxide and 500 nm silicon nitride is used as dielectric. The devices have a reproducible integration density of approximately 1.5 nF/mm² and a surface enlargement from 10 to 12 without the bending of the semiconductor disk having a negative effect on the production process.

Problems with processing structured semiconductor disks when using thick dielectric layers have been documented for the first time in Vom Dorp, J., "Monolithisches RC-Element für leistungselektronische Anwendungen" ("Monolithic RC element for power-electronic applications"). Here, a semiconductor disk structured with deep holes is shown, on which a 1 µm thick silicon oxide layer results in a concave bending of more than 1.5 mm. Here, this is compared to further semiconductor disks on which different dielectric layer stacks having a maximum overall thickness of 750 nm have been produced. The stated disks have a reduced bending of a maximum of 160 µm. However, the used layer stacks are not sufficient for applications with operating voltages of up to 600 Volt.

Initial successes when producing monolithically integrated RC elements for operating voltages up to 600 Volt could be realized by the usage of a dielectric layer stack of 20 nm silicon oxide and 1050 nm silicon nitrate (cf. F. Krach "Silicon Nitride as a Potential Dielectric for 600 Volt Capacitors", WoDiM 2014, Cork, Ireland). The produced devices having an area-related capacitance of 0.66 nF/mm² have a breakdown voltage of approximately 1050 Volt and can be operated at up to 600 Volt with a leakage current of below 10 nA. With a realized surface enlargement of approximately 10, the used 150 mm semiconductor disk, however, shows convex bending of more than 750 µm, illustrated in FIG. 10. In this case, the strong bending prevents depositing and structuring of an additional polyimide passivation layer as it is advantageous for the operation of devices at 600 Volt.

Apart from the breakdown strength, the thickness of the dielectric layers also determines the statistic life span and failure rate of the monolithic capacitors. Predictions for devices with 200 Volts nominal voltage are suggestive of the fact that, for commercial usage of monolithic capacitors with 600 Volt nominal voltage in the industrial and automotive field, layer thicknesses have to be increased further. For this, scaling of the dielectric of the 200 Volt devices might be sufficient. This corresponds to a dielectric layer stack of 60 nm thick silicon oxide and 1500 nm thick silicon nitride. Previous findings, however, show that already with a small surface enlargement, devices having such a layer stack can no longer be produced. Even production on a planar surface does not seem to be possible since the high mechanical tensions of the layers have the effect that the same chip off from the surface or cracks are formed that propagate into the substrate. Further, the low obtainable capacitance also opposes the production of devices on a planar surface or as trench capacitor with a small surface enlargement.

So far, there has been no success in producing monolithically integrated capacitors with an effective layer thickness $d_{CET}$ allowing a surface enlargement V according to the formula $$V = 20 - \frac{16}{\mu m} \cdot d_{CET}$$

on 150 nm disks with a disk bending that is sufficiently small for series production. For disks having a greater diameter, the surface enlargement is limited to an even smaller value.

In a surface structuring by deep holes, bending the semiconductor disk can be reduced by greater distances between the holes due to the usage of thick dielectric layers. However, since the surface enlargement decreases with the square of the distance of the centers of the holes, this method is disadvantageous when a capacitance per chip area that is as high as possible is to be realized. The minimum diameter of the hole structures is limited by the layer thicknesses of the dielectrics to be integrated and the upper contact electrode. For a 200 Volt capacitor with 20 nm silicon oxide, 500 nm silicon nitride and 500 nm polysilicon, hole structures having a diameter of at least 2.04 µm are necessitated.

A further option of reducing the bending of the semiconductor disk is to produce symmetrically opposing depressions having a similar surface enlargement simultaneously on the front and rear, as described in US 2011/0001217 A1. In particular, for realizing monolithically integrated RC elements, this method has the disadvantage that due to the structuring and the dielectric on the bottom of the device, heat dissipation from the volume of the semiconductor disk is significantly reduced. Additionally, for structuring the rear of the disk, an additional photolithography step is necessitated. This allows the production of devices having a respectively high dielectric strength, but is disadvantageous for cost-effective realization. At the same time, such a solution necessitates that a series connection of two capacitors should, for increasing the dielectric strength by the capacitive voltage divider, simultaneously have a good correspondence of the parasitic leakage currents (parallel resistor) (ohmic voltage divider) since otherwise the voltage distribution might shift mainly to one capacitor which would then have to receive the greater part of or the entire voltage. However, due to the very low leakage currents of monolithically integrated capacitors, a deviation of the parallel resistors by a factor of more than 2 is to be expected.

Further, U.S. Pat. No. 8,487,405 B2 describes a method for reducing the convex bending of a semiconductor disk with metal isolator metal (MIM) capacitor structures in deep holes, which includes the usage of additional conductive layers of compressive material. Here, however, the additional layer, on the one hand, increases the production process effort and, on the other hand, claims additional volume in the hole structures, whereby the obtainable surface enlargement is reduced or cannot be fully utilized. In a simple production process, as used for the above described monolithic capacitors with 200 Volt and 600 Volt nominal voltage, the electrically conductive polysilicon layer (contact electrode) is divided during the course of the process for separating individual devices on the semiconductor disk. For this reason, this layer cannot contribute to preventing wafer bending during the whole process.

Thus, integrated capacitors allowing an operation with high electric voltage and/or having high surface enlargement would be desirable.

Thus, it is the object of the present invention to provide a concept enabling integrated capacitors with high dielectric strength and/or high surface enlargement.

This object is solved by the subject matter of the independent claims.

The core idea of the present invention is the finding that dielectric layers of a dielectric structure can be generated such that mechanical overall tensions of dielectric layers counteract each other and in relation to a substrate on which the layers are disposed. The mechanical overall tensions or overall tensions opposing one another allow a reduction or prevention of a bending of the semiconductor substrate during production, such that an integration density of the trench structure is increased and/or higher layer thicknesses of the dielectric layers can be obtained by maintaining current or maximum bendings. At the same time, processability of the semiconductor substrate is maintained. High density of the trench structure allows obtaining a high capacitance of the capacitor. High layer thicknesses of the dielectric layers allow a high dielectric strength.

According to an embodiment, in a method for producing a capacitor, a dielectric structure is generated in a trench of a semiconductor substrate. The dielectric structure comprises a plurality of adjacent dielectric layers comprising opposing material tensions. A material tension induced by a dielectric layer disposed on the substrate, which results in a bending of the semiconductor substrate, is reduced or compensated by an oppositely acting material tension induced by a second dielectric layer, which results in a reduced or prevented bending of the semiconductor substrate.

According to a further embodiment, the semiconductor substrate comprises, along a lateral direction perpendicular to a thickness direction, a first mechanical overall tension, a first dielectric layer disposed on the substrate comprises a second mechanical overall tension and a second dielectric layer disposed on the first dielectric layer comprises a third mechanical overall tension, each including a thermally induced material tension and an intrinsically induced material tension. The second mechanical overall tension is greater than the first and third mechanical overall tension or smaller than the first and the third mechanical overall tension.

Based on the different coefficients of thermal expansion, opposing material tensions can be obtained based on different thermal shrinkages when cooling the semiconductor substrate after depositing the dielectric layers. Further, by a suitable selection of the layer thickness, the compensation of intrinsic material tensions of the semiconductor substrate and/or the dielectric layers is further enabled.

According to a further embodiment, a dielectric layer is formed by forming a partial layer and a second partial layer in a first or second substep. The first substep is spaced apart from the first substep by a predetermined interval. Forming the dielectric layer in a first and second substep reduces or prevents propagation of defects when structuring the amorphous layer between the two substeps such that the dielectric layer has a higher electric reliability.

According to a further embodiment, a capacitor comprises a dielectric structure in a trench of a semiconductor substrate, wherein the dielectric structure comprises a plurality of adjacent dielectric layers having opposing material tensions. This allows high thicknesses of the dielectric structure and a high number of degrees of freedom based on a material selection for each dielectric layer as well as a selection of the order of the dielectric layers.

According to a further embodiment, an inventively produced capacitor is used in a power module. This allows the implementation of coupling capacitors or attenuation elements that are highly integrated, i.e., have a small installation space with high functionality.

Further preferred embodiments are the subject matter of the dependent claims.

Figure 2:
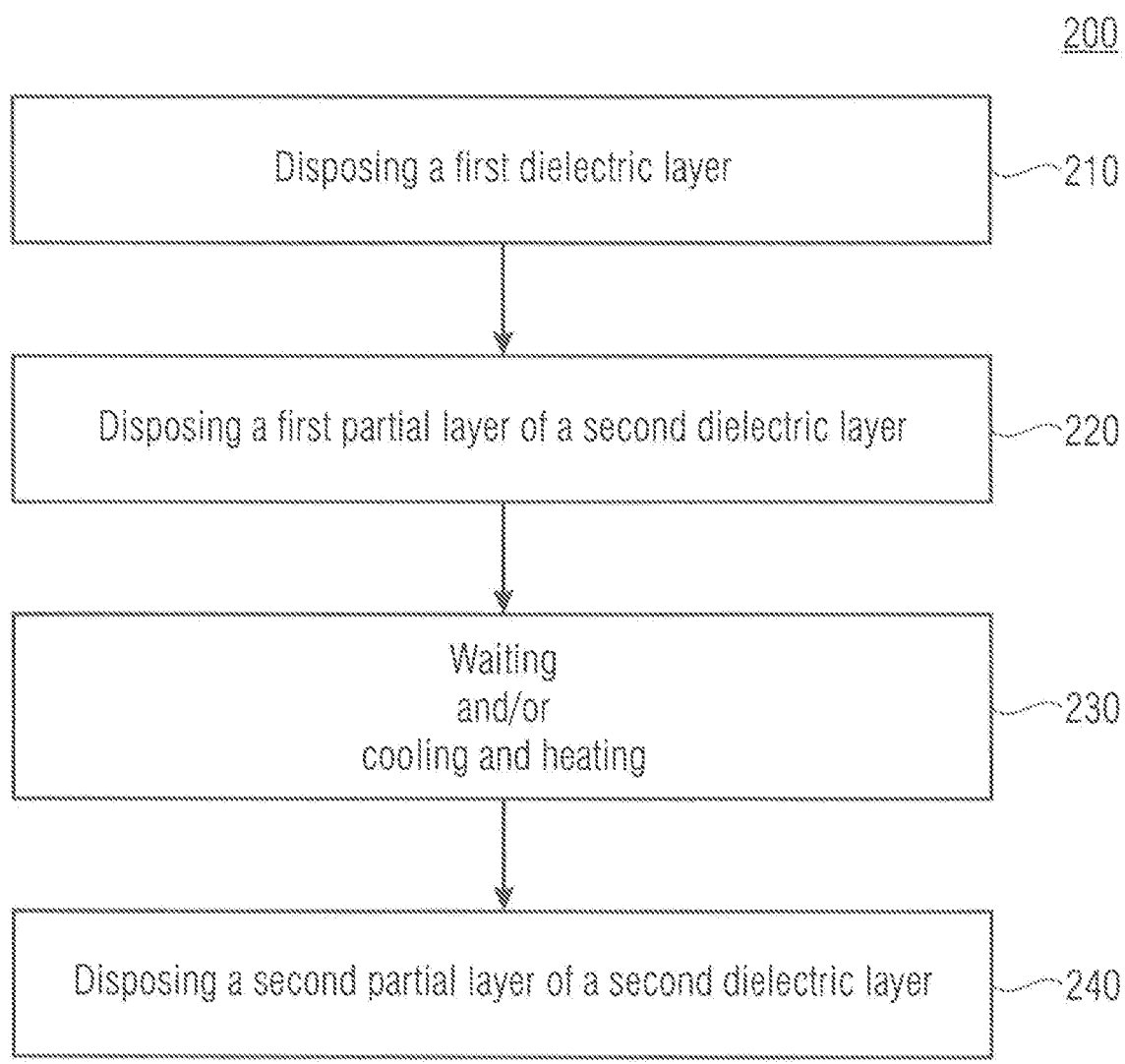
Figure 3:
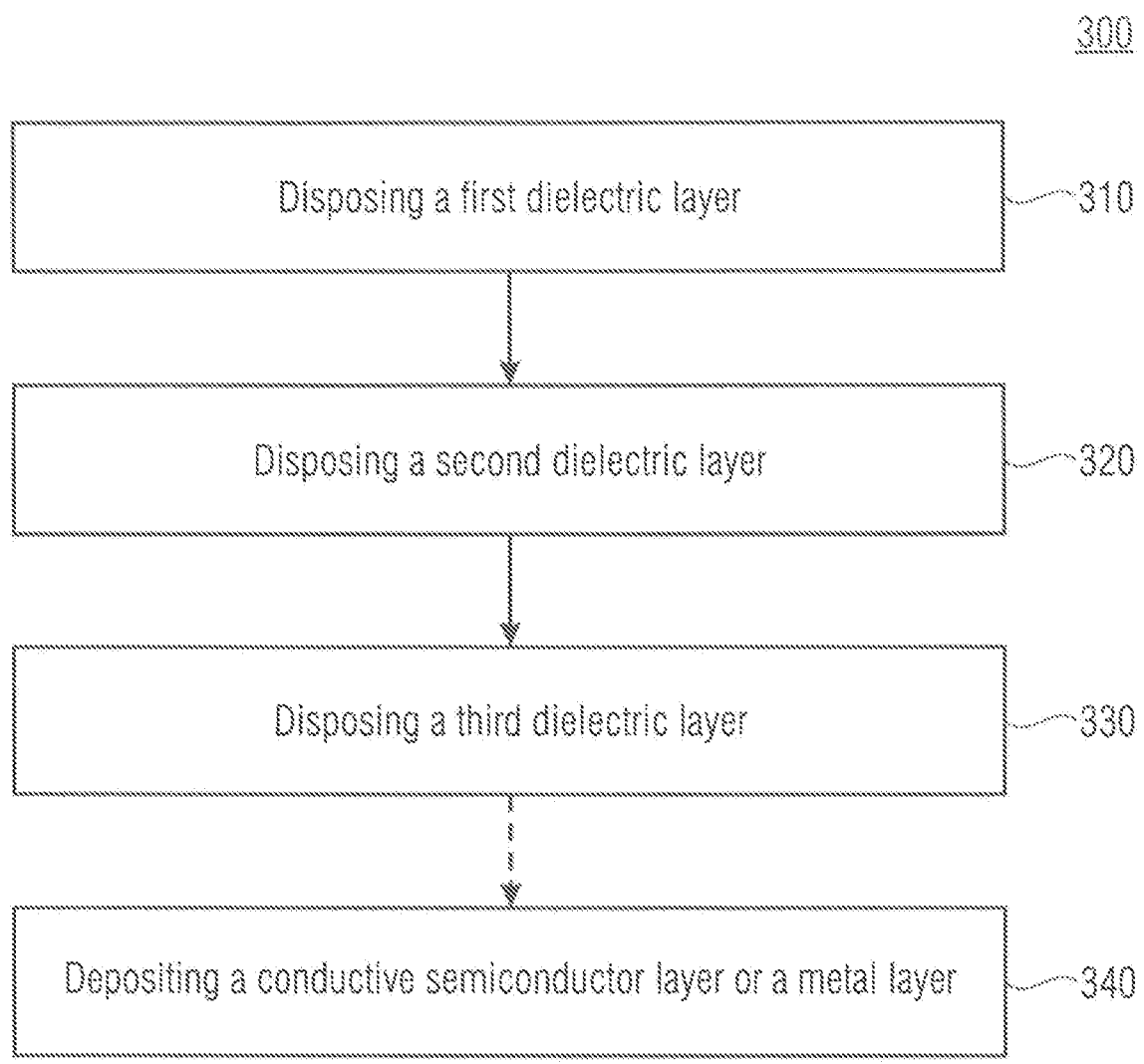
Figure 4:
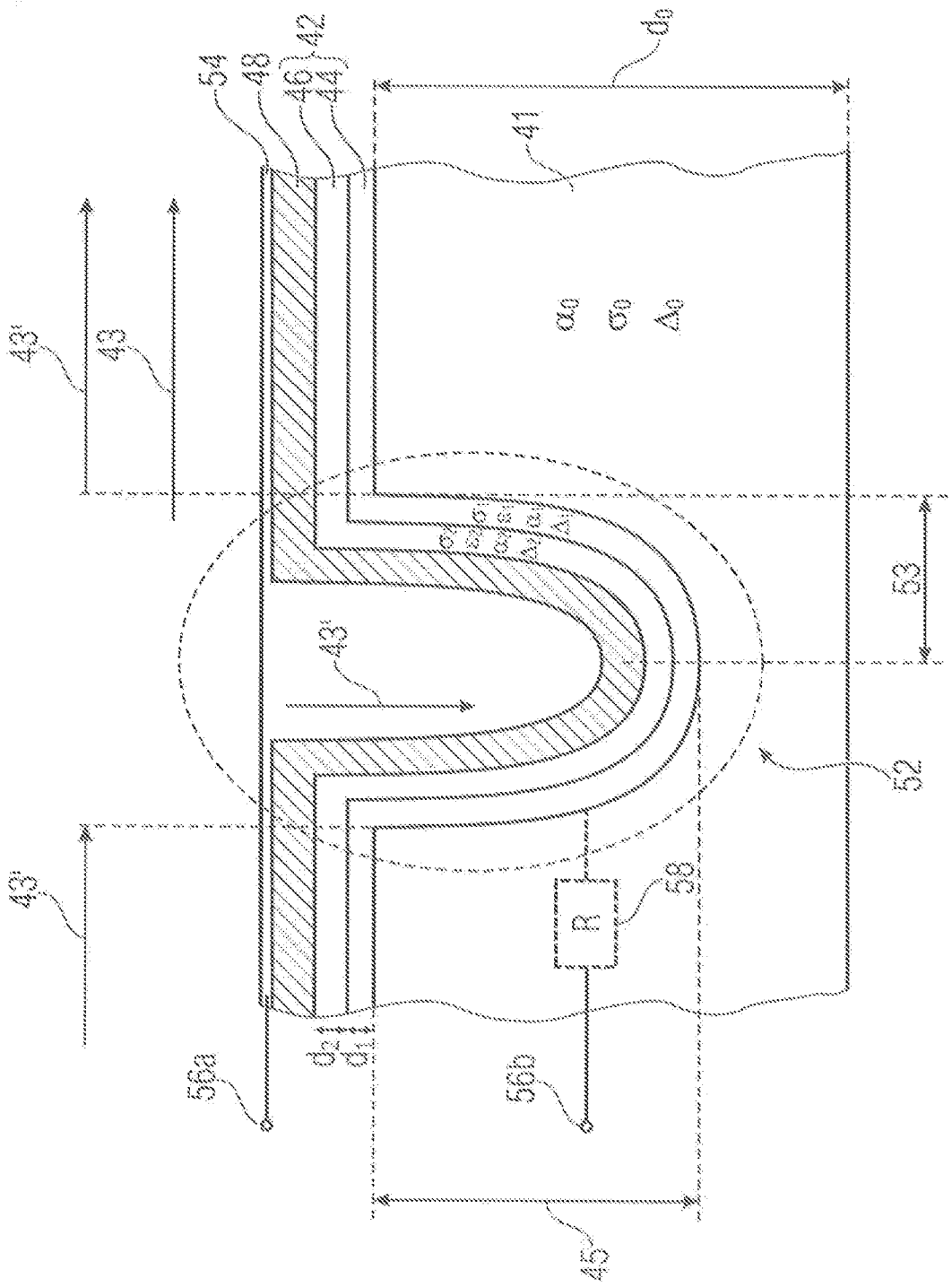
Figure 5:
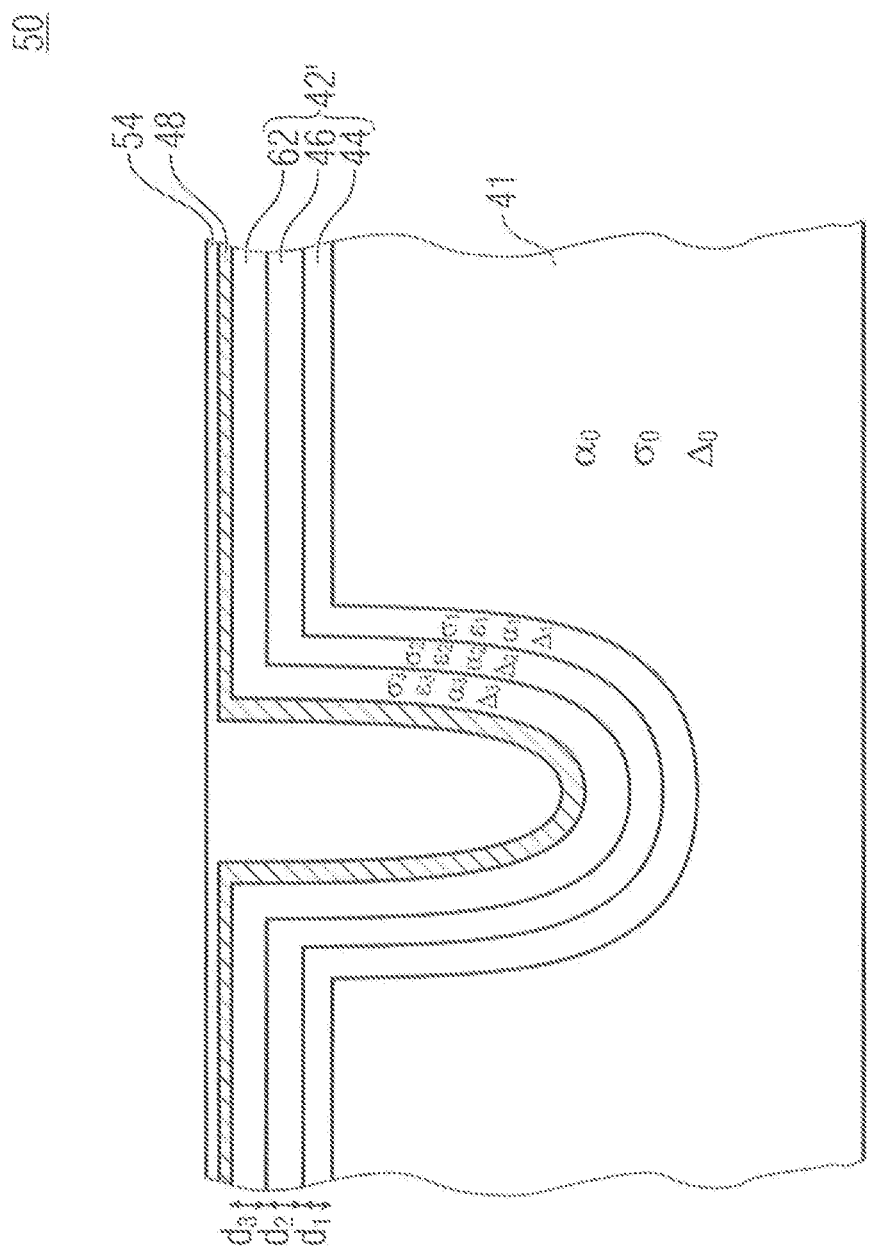
Figure 6:
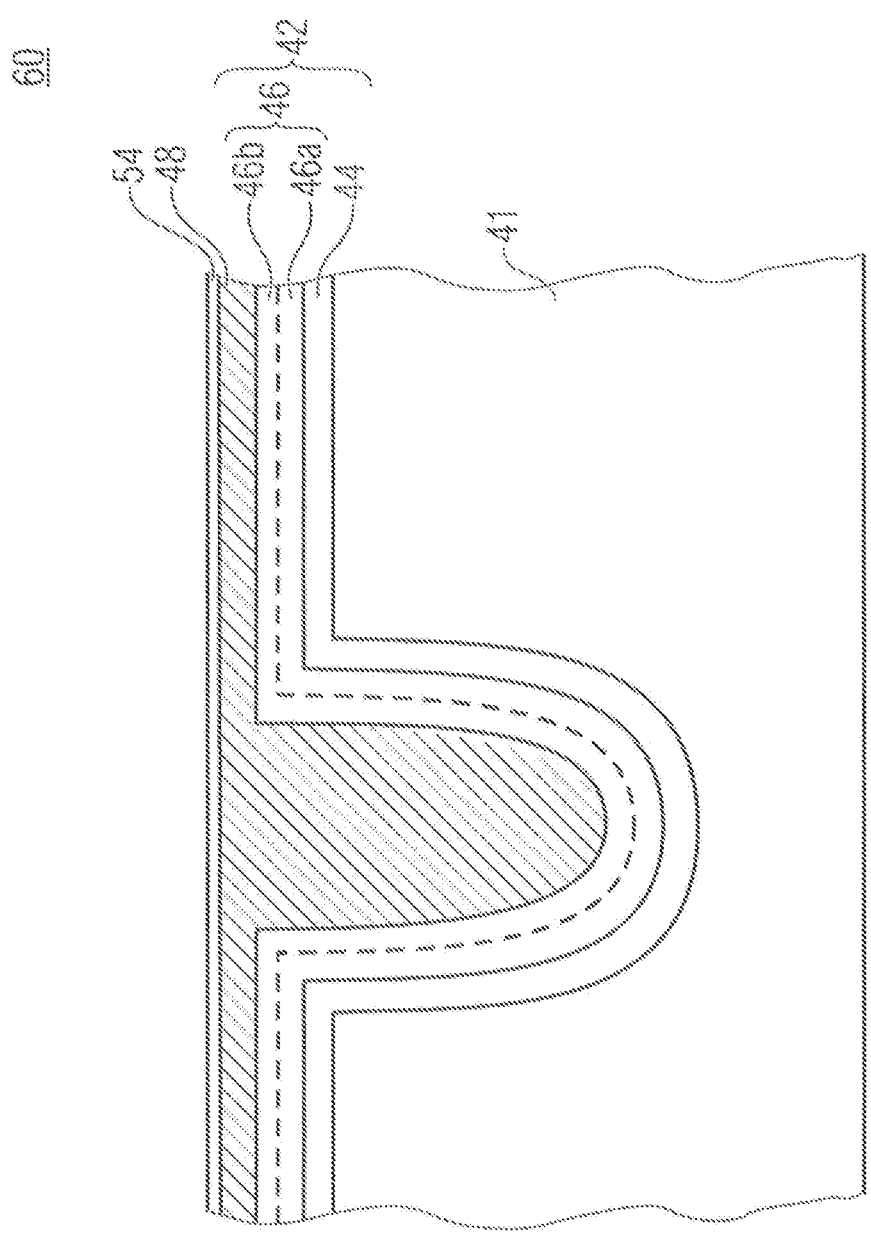
Figure 7B:
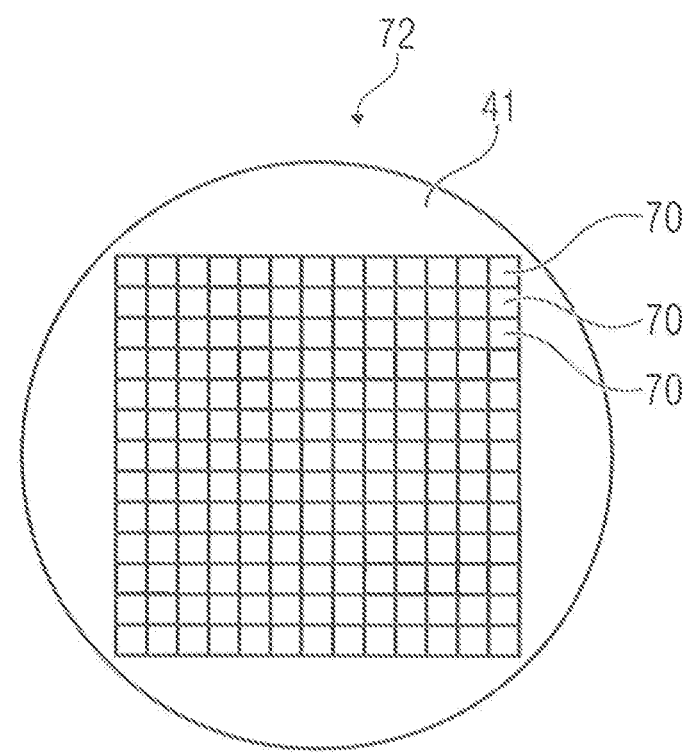
Figure 8:
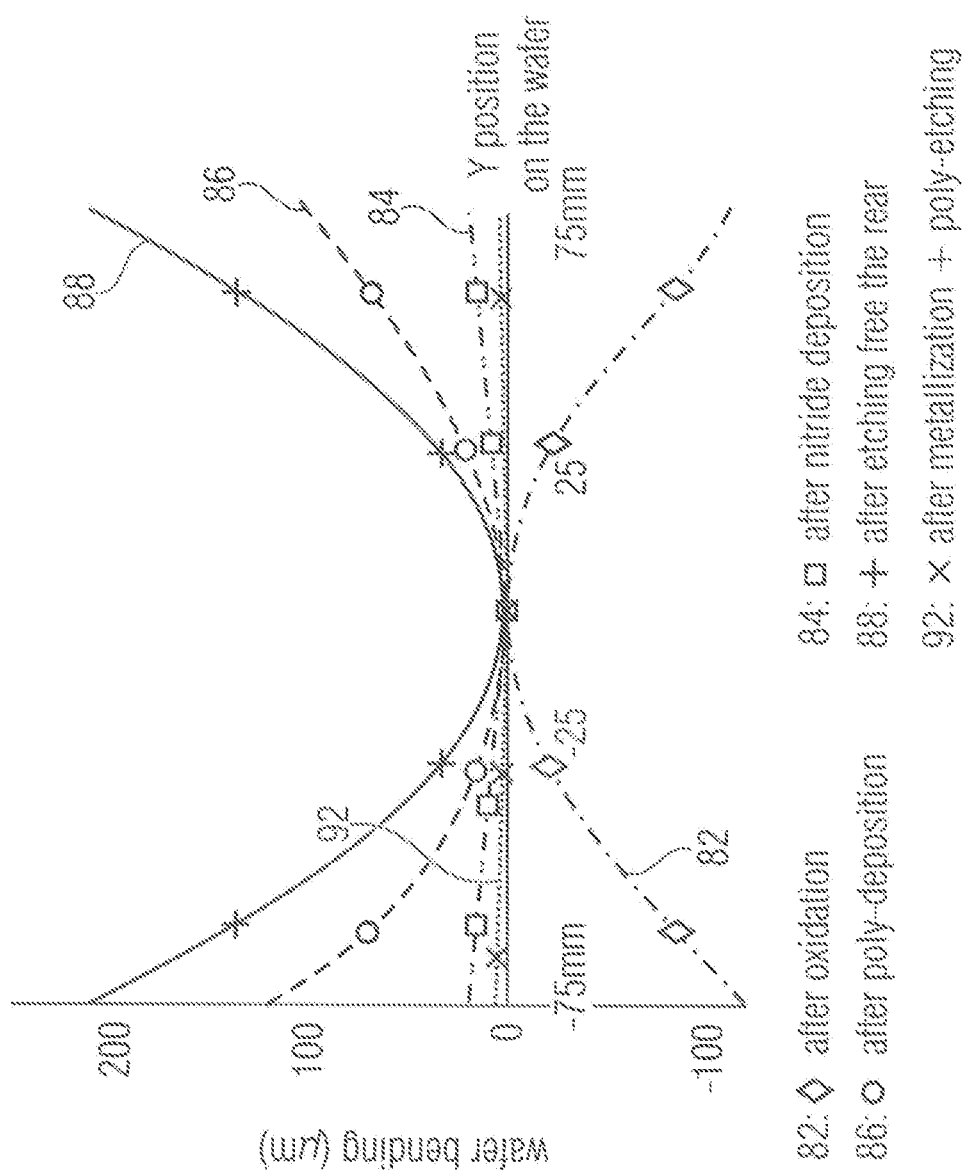
Figure 9:
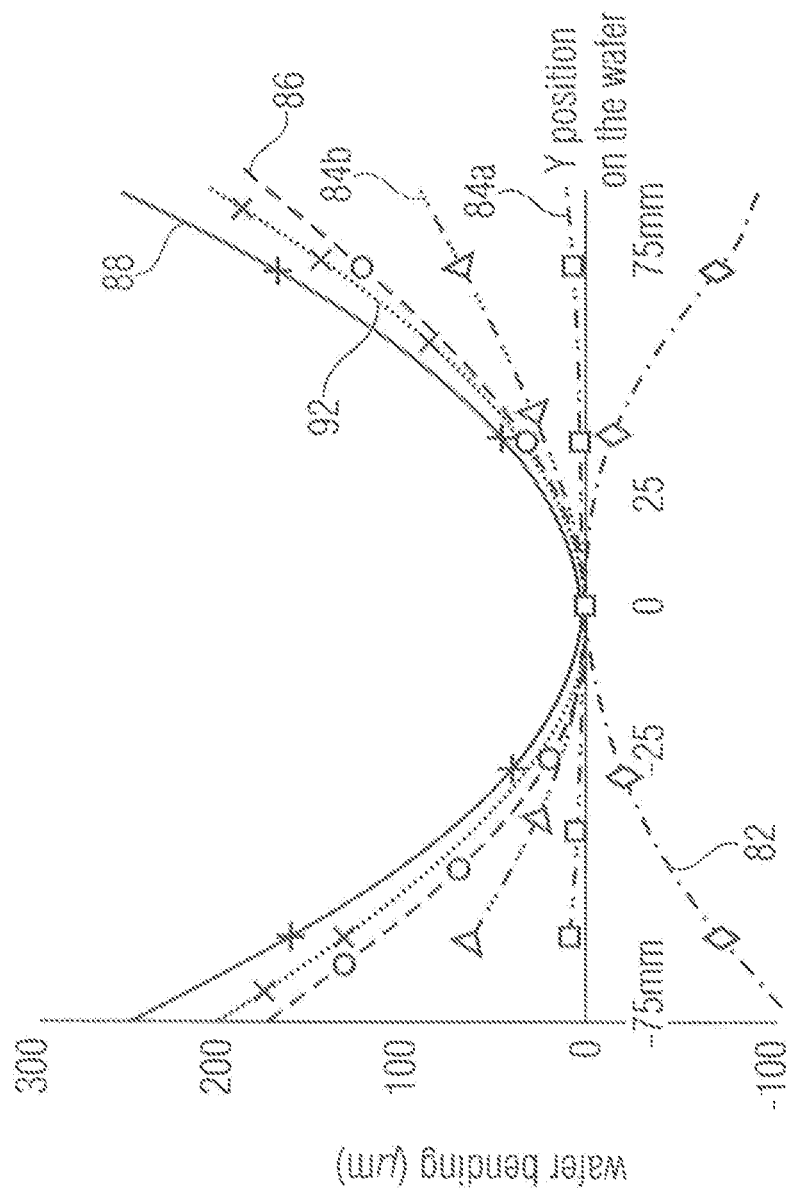
Figure 10:
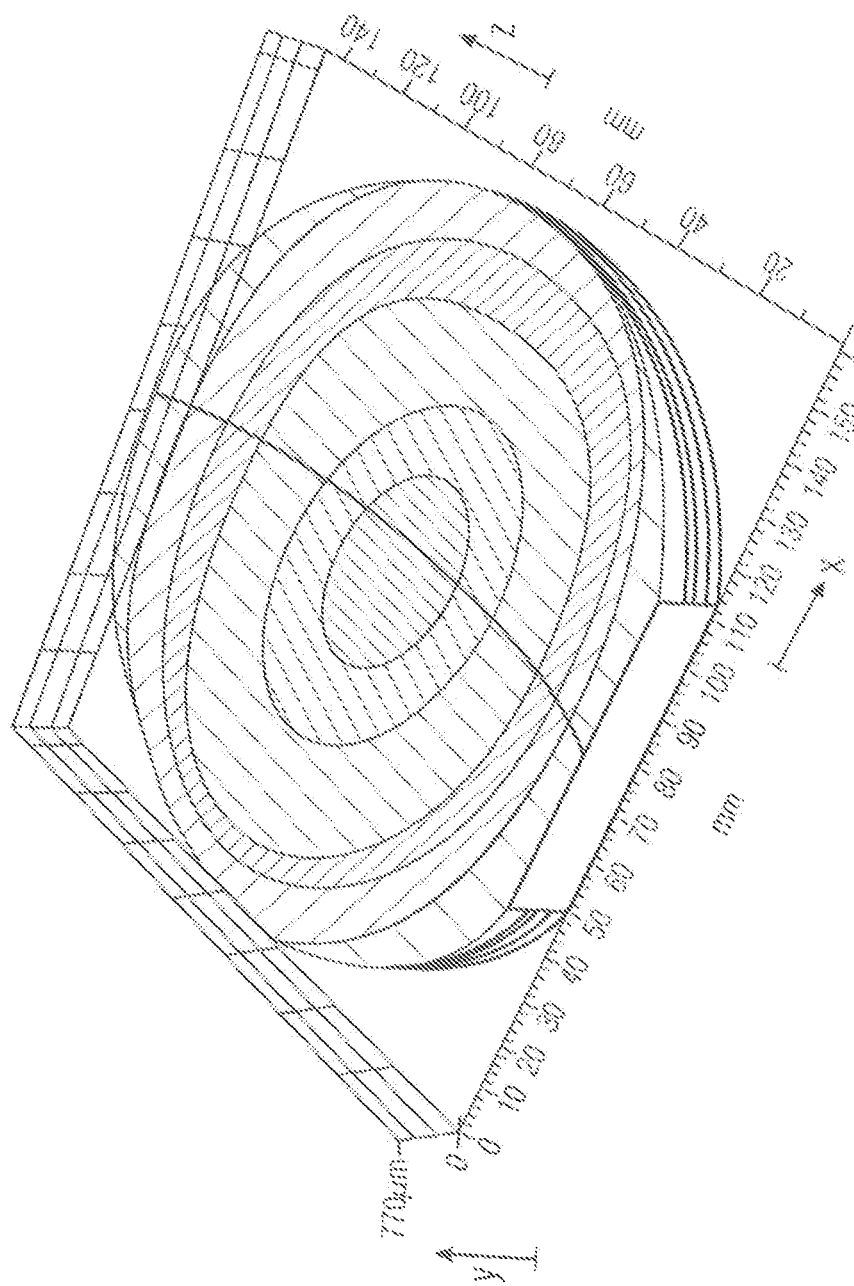

Preferred embodiments of the present invention are discussed below with reference to the accompanying drawings. They show:

FIG. 1 a schematic flow diagram of a method for producing a capacitor according to an embodiment;

FIG. 2 a schematic flow diagram of a method for generating the dielectric structure, wherein a dielectric layer is disposed in two substeps according to an embodiment;

FIG. 3 a schematic flow diagram of a method for generating the dielectric structure with a first, second and third dielectric layer according to an embodiment;

FIG. 4 a section of a schematic side sectional view of a capacitor as it can be produced by the method of FIG. 1 according to an embodiment;

FIG. 5 a section of a schematic side sectional view of a capacitor, wherein, compared to the capacitor of FIG. 4, a dielectric structure comprises a third dielectric layer according to an embodiment;

FIG. 6 a section of a schematic side sectional view of a capacitor, wherein a dielectric layer of the dielectric structure is formed by means of two partial layers according to an embodiment;

FIG. 7a a schematic side sectional view of an intermediate product of a capacitor, wherein a dielectric structure is formed on a first main side surface and a further dielectric structure is formed on a second main side surface according to an embodiment;

FIG. 7b a schematic top view of a wafer with a plurality of capacitors described in FIG. 7a prior to a separation of the individual components;

FIG. 8 exemplarily a (measured) curve of a bending of a wafer during the production of capacitors according to an embodiment;

FIG. 9 a schematic illustration of different (measured) bendings of the wafer where, compared to the illustrations in FIG. 8, the dielectric layer is approximately twice as thick according to an embodiment; and FIG. 10 a schematic perspective view of a bending of a silicon wafer having a diameter of 150 mm according to the prior art.

Before embodiments of the present invention will be discussed in detail based on the drawing, it should be noted that identical, functionally identical or equivalent elements, objects and/or structures in the different figures are provided with the same reference numbers, so that the description of these elements illustrated in different embodiments can be interchanged or can be applied to one another.

In the following, reference is made to intrinsic and thermal material tensions Δ. Thermal material tensions Δ are explained such that based on positive coefficients of thermal expansion α materials shrink with respect to an adjacent layer and/or a (semiconductor) substrate during cooling. It is obvious that heating can result in an expansion. Further, the following statements can also be understood such that materials perform a negligible deformation during heating or cooling, i.e., the coefficient of expansion is approximately zero. Alternatively, the coefficient of thermal expansion can also be negative, for example for zinc cyanide or zirconium tungstate, such that the following statements concerning the thermal expansion are interchangeable in this regard.

In the following, reference is made to trenches or trench structures of an integrated MIS capacitor (MIS=metal insulator semiconductor), a so-called 3D capacitor. Here, trenches can also be hole, groove or column structures having a two-dimensional lateral expansion along a substrate surface and an expansion along a depth direction perpendicular to the substrate surface. Further, a trench structure can have one or several trenches. Several trenches can be designed differently with regard to expansion, depth or shape.

FIG. 1 shows a schematic flow diagram of a method 100 for producing a capacitor. In a step 110, a semiconductor substrate having an above described trench structure is disposed. The semiconductor substrate can, for example, be a silicon wafer by means of which a plurality of semiconductor based capacitors are to be produced. Silicon wafers having a diameter of 100 mm, 150 mm or 200 mm or other, in particular greater, values, for example, are conceivable. Alternatively, the semiconductor substrate can also be doped or undoped organic or inorganic semiconductor materials. Further, the semiconductor substrate can also be arranged in other forms than the one of a wafer, for example in already separated wafer parts (possibly after dicing). Preferably, the semiconductor substrate comprises several trenches, since the same can result in surface enlargement and hence in a higher functional density of the capacitor. The trench or alternatively a trench structure including several trenches results in a surface enlargement of the semiconductor substrate with regard to a main surface area (possibly a top or bottom of the wafer) comprising the trench or the trench structure. The trench structure can comprise several trenches with several holes, columns, grooves or a combination thereof.

In a step 120, a dielectric structure is generated with a plurality of adjacent dielectric layers in the trench or a trench structure of the semiconductor substrate. The plurality of adjacent dielectric layers comprise opposing material tensions, i.e., mechanical overall tension.

The material tensions (mechanical overall tensions) can include thermally induced material tensions and/or intrinsic material tensions. The intrinsic material tensions can, for example, be at least partly induced by a lattice mismatch within a lattice structure of the semiconductor substrate or a dielectric layer or between lattice structures of adjacent layers. A dopant, such as boron or phosphor can result in a doped material, such as silicon, to a modified lattice structure of the doped material. Alternatively or additionally, when growing one layer, differing lattice or grain sizes of adjacent layers can result in material tensions in the other. Thermally induced material tensions can result, for example, by depositing a dielectric layer with a temperature that is above room temperature. During cooling and with different coefficients of thermal expansion of the semiconductor substrate and the dielectric layer (or further dielectric layers), the respective materials can have a differing shrinkage factors, i.e., coefficients of thermal expansion. The differing shrinkage results in the thermally induced material tensions. Below, thermally induced and intrinsic material tensions will be referred to as overall tension wherein one of the two parts can also have a negligible value or proportion, for example, 0. A change of temperature between the deposition of different layers can also result in thermal material tensions.

Simply put, the dielectric structure can be generated such that the same covers the trench structure and possibly the substrate outside the trench in a planar manner. A first dielectric layer of the dielectric structure can comprise, for example, silicon oxide. A second dielectric layer of the dielectric structure can comprise, for example, silicon nitride. Alternatively, one of the dielectric layers or a further dielectric layer can also include different dielectric materials, for example titanium oxide, tantalum oxide, hafnium oxide, aluminum oxide, lanthanum oxide or the same. The dielectric structure can be generated, for example, by oxidizing the silicon on the semiconductor substrate, when the same includes silicon, by means of thermal oxidation in an oxygen environment and in this way a silicon oxide layer is generated. Thermal oxidation can be performed as dry or wet oxidation. The oxidation can be performed at a temperature between 800° C. and 1200° C., between 900° C. and 1100° C. or in a temperature range between 1000° C. and 1070° C., preferably approximately at 1050° C. A layer thickness of the silicon oxide layer can be at least 200 nm, at least 300 nm (for example 333 nm) or more. A higher temperature at which the oxidation is performed can be advantageous for increasing layer thicknesses.

A second dielectric layer, for example including silicon nitride, can be generated on the silicon oxide layer. Silicon nitride can be generated, for example, by means of chemical vapor deposition. Chemical vapor deposition can be generated at low pressure (low pressure chemical vapor deposition; LPCVD). This can be performed, for example by using dichlorsilane and ammonia in a temperature range of, for example, 700° C. to 900° C., 720° C. to 850° C. or 750° C. to 800° C. Thus, this temperature can be lower than a temperature at which the silicon oxide is formed. The silicon nitride layer can be deposited, for example, with a thickness of at least 400 nm, at least 500 nm or at least 1000 nm. As an alternative to LPCVD, plasma enhanced chemical vapor deposition (PECVD), high pressure chemical vapor deposition (HPCVD), atmospheric pressure chemical vapor deposition (APCVD), physical vapor deposition (PVD) or another method can be used. Further, silicon (di)oxide can have another lattice structure, i.e., a differing interatomic distance in the amorphous atomic structure than silicon nitride and/or silicon.

Based on intrinsic material tensions and/or thermal deformation when cooling the material after oxidation, the semiconductor substrate as well as the oxide layer can show deformation or bending, for example convex or concave. Mechanical tensions of the silicon nitride layers counteract mechanical tensions of the silicon oxide layer or are opposite to the same.

The counteracting material tensions result in a lower bending of the semiconductor substrate during the method 100. This allows higher surface enlargement and/or thicker dielectric layers that would each result again to a stronger bending such that maximum bending, for example based on process parameters, can still be maintained.

Silicon nitride can have a coefficient of thermal expansion $\alpha$ in a range from, for example, 3.3 to $3.5 \cdot 10^{-6}$/K. Silicon oxide, on the other hand, typically has a coefficient of thermal expansion a of approximately $5.6 \cdot 10^{-7}$/K. Thus, silicon oxide shrinks to a lesser extent than silicon nitride when both materials are cooled, which results in thermal material tensions between the layers. If the semiconductor substrate includes silicon, which has a coefficient of thermal expansion a in a range of approximately $2.6 \cdot 10^{-6}$/K, in the previous embodiment, the first dielectric layer disposed on a semiconductor substrate has a lower coefficient of thermal expansion than the semiconductor substrate and than the second dielectric layer disposed on the first dielectric layer. Thus, for example, a silicon nitride layer can be disposed on the semiconductor substrate and the silicon oxide layer on the silicon nitride. Further, other or further dielectric layers of the dielectric structure can be generated, wherein preferably material tensions of two "outer" layers (for example substrate and second dielectric layer) counteract a material tension of an inner layer (for example first dielectric layer).

According to alternative embodiments, a material tension of a first and a fourth, fifth or higher dielectric layer deposited in this order on the substrate counteracts a material tension of a second and/or third dielectric layer.

In a step 130 of the method 100, an electrode material is deposited on the dielectric structure. If an arrangement of semiconductor substrate and dielectric structure is referred to as stack, wherein the substrate forms, for example, the bottom, the electrode material is deposited on the top of the stack, which means on the side of the dielectric structure facing away from the semiconductor substrate. The electrode material can, for example, be polysilicon (polycrystalline silicon) which is subsequently doped, or in situ doped polysilicon which is deposited, for example, at 570° C. and hence at a temperature which is further reduced compared to the above steps. Alternatively, the polysilicon can also be disposed by means of a diffusion process, for example a $POCl_3$ process and/or at temperatures increased with respect to previous steps (for example approximately 950° C.). Also, conform deposition of a metal layer is possible. The electrode material allows planar contacting of the topographically non-planar dielectric structure. If the dielectric layers are deposited with a homogeneous layer thickness in the trench or in or at the trench structure, the surface of the dielectric structure essentially has a similar or geometrically similar height difference as the trench structure. The electrode material can also comprise comparable height differences, i.e. completely or partly balance the height differences which completely or partly fill the remaining trenches. A possible additional metallic contact allows obtaining a planar surface which can be produced in an optional step 140. For this, a metallic layer can be disposed on the surface of the dielectric structure. If the electrode material does not completely fill the dielectric structure, the metallic contact can compensate remaining height differences. Alternatively, a surface of a capacitor can also have a non-planar surface. Alternatively, the electrode material can also be contacted locally in an electrical manner in step 140, wherein contacting is preferably performed with low ohmic resistance. This can be obtained by metallic contacting. An aluminum layer having a thickness of approximately 3 µm to 4 µm allows, for example, electric contacting by means of bond wires.

Generating the dielectric structure by dielectric layers having opposing material tensions can have the effect that maximum bending of the semiconductor substrate during processing remains below a predefined upper limit. The predefined upper limit can be influenced, for example, by deflection amplitudes where one or several layers of the semiconductor substrate and/or the dielectric structure show damages, for example by breakage. Alternatively or additionally, the maximum bending can be influenced by external demands, for example a receiving option of a lifting or suction device. A suction device for receiving the semiconductor substrates can, for example, be implemented to transport a silicon wafer having a maximum bending of 350 µm with respect to a center to an outer edge of the wafer by means of negative pressure. If the semiconductor substrate and/or the dielectric structure have a higher bending, generation of the negative pressure can, for example, be prevented or reduced.

The method 100 includes an optional step 150 where material of the dielectric structure is removed from a side of the semiconductor material facing away from the trench structure. The side facing away from the trench structure can be considered as rear side when the trench structure is dispose on or in the front of the semiconductor substrate. If the semiconductor substrate has the trench on one side, the material of the dielectric layers can be deposited during deposition of the same on both or all sides of the semiconductor substrate. For electric contacting of the rear and/or for reducing the size, unnecessary material can be removed from the rear. Alternatively, the semiconductor substrate can have the trench structure or a trench on both main sides (front and rear). In this case, removing the material of the dielectric structure from the rear and hence step 150 can be omitted. Alternatively, removal of the material from the rear can also be omitted when the material is not spurious or intended. In that case, process costs can be reduced. Thus, a layer stack that can possibly be electrically contacted by means of a soldering process can be disposed on the whole area (structured or unstructured). The material can, for example, be intended when the semiconductor substrate on the rear also comprises at least one trench that is to be covered by a dielectric structure. Steps 140 and 150 can be performed in any order.

In an optional step 160 of the method 100 a plurality of capacitors are mechanically separated in the semiconductor substrate. If the semiconductor substrate is, for example, the silicon wafer, a plurality, for example more than 100, more than 500 or even more than 1000 capacitors per wafer can be produced (simultaneously). In step 160, the same can be mechanically separated (dicing), for example by means of a cutting, etching or breaking process or by thermal laser separation.

The semiconductor substrate and dielectric layers can each comprise an intrinsic material tension. Thermally induced material tensions between the materials of adjacent layers can be at least partly induced based on the interaction of differing coefficients of thermal expansion of the layer materials. Layer thicknesses of layers of the dielectric structure can hence be selected based on the respective intrinsic material tension as well as the coefficients of thermal expansion, wherein due to the at least partial compensation of deformation of the overall structure, high layer thickness is enabled by using materials having high dielectric constants. This enables realization of semiconductor based capacitors, both comprising a high capacitance, for example with an integration density of $\geq 0.5$ $nF/mm^2$, $\geq 1.0$ $nF/mm^2$ or $\geq 1.25$ $nF/mm^2$ as well as a high continuous operating voltage (operating voltage enabling low-damage continuous operation of the capacitor) of $\geq 300$ V, $\geq 400$ V or $\geq 600$ V. Further, based on the low bending of the overall structure, high surface enlargement of the semiconductor substrate can be obtained by means of the trench or the trench structure resulting in a further increase of the capacitance of the generated capacitor.

If the semiconductor substrate is provided, for example as a wafer, the dielectric structure can be formed across several or all capacitor areas of capacitors (areas that will later form a capacitor) together as well as across intermediate areas between the same, such that a dielectric structure covers some or all of the capacitors. In a wafer implemented in a round manner having a diameter of 150 mm, the convex or concave deformation can preferably be maintained within a range of $\leq 350$ µm, $\leq 300$ µm or $\leq 250$ µm. Wafers having a greater diameter can be processed to such a deflection in an inner area having a diameter of 150 mm. Alternatively, the maximum deflection of the concave or convex deformation of $\leq 350$ µm, $\leq 300$ µm or $\leq 250$ µm can be related to the whole extension of the wafer. This means that in wafers having diameters of more than 150 mm an overall deformation (bending) is maintained within the above-stated range, such that, for example, less bending relative to a wafer having 150 mm diameter is enabled per produced component, i.e., per unit area.

The method 100 can comprise further steps, for example disposing an electrically insulating layer on the electrode material or on a metallic layer covering the electrode material. An electrically insulating layer allows passivation of the member with respect to its environment.

FIG. 2 shows a schematic flow diagram of a method 200 for generating the dielectric structure. The method 200 can, for example, be part of step 120. In a step 210, the first dielectric layer, for example silicon (di)oxide is disposed. In a step 220, a first partial layer of a second dielectric layer is disposed. The second dielectric layer can, for example, be a layer including a material differing from silicon oxide, such as silicon nitride or aluminum oxide. In a step 230, a predetermined distance to a step 240 is bridged, wherein a second partial layer of the second dielectric layer is disposed. This means that the second dielectric layer is disposed by means of a first partial layer in a substep 220 and by means of a second partial layer in a substep 240, wherein the first substep and the second substep are spaced apart from one another by step 230.

In step 230, cooling and subsequent heating, such as from a process temperature to a lower temperature (for example a temperature reduced by 100° C. or more, room temperature or lower temperatures) and subsequent heating back to the process temperature can be performed. There can be a time period between cooling and heating, in which the material remains at a temperature to which the material is cooled. Alternatively, the step 230 can merely comprise waiting, i.e., maintaining the process temperature without deposition or disposal of dielectric material. Waiting can include, for example, a time period of at least 30 minutes, 60 minutes or 120 minutes. Remaining at the process temperature without disposing dielectric material (or by disposing a small amount thereof) can allow annealing of the dielectric layer. Alternatively, the dielectric layer can be heated starting from the process temperature and without depositing dielectric material and can subsequently be cooled again to a process temperature. Alternatively, the second dielectric layer can also be disposed in a number of one or more than two substeps, i.e. partial layers.

Disposing the second dielectric layer in two or more partial layers allows reduction or prevention of propagation of defects in a material of the dielectric layer. Defects can occur during deposition or generation, for example based on differing lattice structures and/or inhomogeneities of a deposited layer material. The mismatches or inhomogeneities (defects) can propagate and/or increase with increasing layer thickness, for example, by continuous growing of the layer. Each of the partial layers can be considered as newly disposed layer comprising new and partly different defects (defect origins). During CVD deposition, the same occur, for example, due to nucleation processes at the beginning of the deposition reaction on the semiconductor disc. If an end of a first defect and the beginning of a second new defect are spaced apart, the first defect is interrupted. By means of the two or more spaced-apart substeps 220 and 240, defect propagation between the substeps can be reduced or prevented. Put simply, disposing the second partial layer enables the disposal of a further layer including the same material with new defects, wherein the defects of the previous partial layer are inhibited or prevented from propagating. Alternatively, the first dielectric layer can also be formed by means of two partial layers. Disposing a dielectric layer in partial layers can also be performed in more than two partial layers.

FIG. 3 shows a schematic flow diagram of a method 300 for generating the dielectric structure. Steps 310, 320 and/or 330 of the method 300 can, for example, be partly performed in step 120 of method 100.

In step 310, a first dielectric layer is disposed. In step 320, a second dielectric layer is disposed. In step 330, a third dielectric layer is disposed. Preferably, the first, second and third dielectric layers have opposing material tensions, i.e. the first dielectric layer has material tensions opposing the second dielectric layer, and the second dielectric layer has material tensions opposing the dielectric layer. Alternatively, the first dielectric layer can have material tensions opposing the material tensions of the second and third dielectric layers, or the third dielectric layer can have material tensions opposing the ones of the first and second dielectric layers. This means that the dielectric layer can have material tensions opposing the one or several other dielectric layers or material tensions of the semiconductor substrate.

Alternatively, in step 330 or further steps, further dielectric layers can be disposed or generated. In an optional step 340, a conductive semiconductor layer or alternatively a metal layer is deposited on the third or last dielectric layer. Step 340 can be performed, for example, as part of step 140. A material including polysilicon can be disposed, for example, on the third or last dielectric layer. Alternatively, and as indicated by the dotted arrow between step 330 and step 340, another step can be performed, such as step 150 or 160.

FIG. 4 shows a section of a schematic side sectional view of a capacitor 40 as it can be produced by the method 100. The capacitor 40 includes the semiconductor substrate 41 and the dielectric structure 42 including a first dielectric layer 44 and a second dielectric layer 46 disposed on the semiconductor substrate 41 in that order. Further, the capacitor 40 includes an electrode material 48 disposed on the second dielectric layer 46 and covering the same in a planar manner. Thereby, the electrode material 48 partly "fills" a trench 52 which is formed in the semiconductor material 41 and covered by the dielectric structure 42, such that a surface of the second dielectric layer 40 is covered in a planar manner. A metallic layer 54, including at least one metallic material, such as gold, silver, copper, platinum, aluminum, or the same is disposed on the electrode material 48 for contacting the electrode material 48. Alternatively, the electrode material 48 can also completely fill a remaining trench volume. The electrode material 48 can comprise, for example, a semiconductor material such as polysilicon. Alternatively or additionally, the electrode material 48 can also include metallic materials, such as gold, silver, platinum, copper, aluminum or the same. If the electrode material 48 includes completely metallic materials, the electrode material 48 and the metallic layer 54 can be integrally formed and/or merely one of the layers can be disposed for electrically contacting the dielectric structure 42. Put simply, contacting the dielectric structure 42 can be performed by means of the metallic layer 54 and an optional semiconductor layer between the same and the dielectric structure 42.

On a rear of the semiconductor substrate 41, i.e. on a side facing away from the dielectric structure 42, a dielectric structure is removed or not disposed.

An electric voltage can be applied between a terminal 56a and a terminal 56b of the capacitor 40. The terminal 56a is connected to the metallic layer 54. The terminal 56b is connected to the semiconductor substrate 41. Semiconductor characteristics of the semiconductor substrate 41 result in a possibly temperature-dependent ohmic resistance 58 effective between the terminal 56b and the dielectric structure 42. Thus, the capacitor 40 can be used as attenuation element, such as a low pass or a so-called RC snubber. The capacitor 40 can also be referred to as integrated trench capacitor when the equivalent serial resistance (ESR) is sufficiently small. This can be effected, for example, by the usage of a highly doped semiconductor substrate.

The first dielectric layer 44 has a first coefficient of thermal expansion ai and a first dielectric constant $\varepsilon_1$. The first temperature coefficient ai results in a thermally induced material tension $\Delta_1$. The second dielectric layer has a second coefficient of thermal expansion $\alpha_2$ and a second dielectric constant $\varepsilon_2$. The first temperature coefficient $\alpha_2$ results in a thermally induced material tension $\Delta_2$. The coefficient of thermal expansion $\alpha_1$ and/or $\alpha_2$ can differ from a coefficient of thermal expansion $\alpha_0$ of the semiconductor substrate 41 which results in a thermally induced material tension $\Delta_0$. Put simply, the first dielectric layer 44 and the second dielectric layer 46 are formed of different dielectric materials. A ratio of the dielectric constants $\varepsilon_1$ and $\varepsilon_2$ can be selected based on a thickness ratio of the dielectric layers 44 and 46 for obtaining an overall effective dielectric constant. The selection of the dielectric constant or its adjustment can be used for adjusting an effective capacitance of the capacitor 40. Alternatively or additionally, a preselection of the used materials can be performed based on an overall breakdown field strength to be obtained. Subsequently, material selection and/or a selection of the thickness ratios can be performed.

The semiconductor substrate 41 as well as the dielectric layers 44 and 46 each comprise an overall (material) tension. The same includes an intrinsic material tension and a thermally induced deformation (material tension), for example when cooling the structure after depositing a layer. Different coefficients of thermal expansion of the semiconductor substrate $\alpha_0$ and/or ai and $\alpha_2$ of the dielectric layers 44 and 46 can result in induced tensions. Further, the semiconductor substrate and the dielectric layers 44 and 46 each include the intrinsic material tension $\sigma_0$, $\sigma_1$ or $\sigma_2$, caused at least partly by foreign atoms (for example, a dopant) in a crystal lattice (for example the semiconductor material) or by mismatches of individual molecules to one another.

Alternatively, for example, when a proportion of the intrinsic tension or the thermally induced material tension of the overall tension is low, for example less than 30%, less than 20% or less than 10%, compensation of the material tensions can also be performed based on the thermally induced material tensions or the intrinsic material tensions.

Here, the overall material tension acts along a lateral direction 43, for example a longitudinal or width direction or radial direction arranged perpendicular to a direction of the thicknesses $d_1$ and $d_2$ with respect to the semiconductor substrate 41 and can cause a convex or concave deformation of the semiconductor substrate 41. A lateral direction 43' is essentially parallel to a surface of the semiconductor substrate and, for example, parallel to the lateral direction 43 outside the trench 52 and differing therefrom inside the trench 52, such as partly perpendicular to the same. Along the lateral direction 43', the dielectric structure 42 or the first dielectric layer 44 and/or the second dielectric layer 46 can comprise a change of direction (inversion) of an orientation of the overall material tension (positive/negative) with respect to the semiconductor substrate 41. The inversion can relate to a first area of the semiconductor substrate 41 comprising the trench 52 and a second area of the semiconductor substrate 41 not comprising the trench 52. If the first dielectric layer 44 comprises, for example in an area outside the trench 52, a shear stress with respect to the semiconductor substrate 41, the dielectric layer 44 can have a tensile stress in the area of the trench 52 in relation to the semiconductor substrate 41 or can induce the same in a semiconductor substrate 41 and vice versa. The inversion can be caused by material changes, for example by "silicon consumption" (oxidized silicon) during oxidation of the silicon for generating or depositing a silicon oxide layer 44 on the semiconductor substrate 41. For oxidation, the semiconductor substrate 41 can provide "less" silicon at a surface border (edge) of the trench 52 compared to an inner curvature (valley) of the trench 52, which is why the directions along which the overall tensions act with respect to the semiconductor substrate 41 can be inverted. Alternatively or additionally, the differing overall tensions can induce a deformation in the trench, such that the lateral direction 43 in the trench 52 partly corresponds to a thickness direction of the semiconductor substrate 41. A depth 45 of the trench structure 52 can be many times greater than a width 53 of the trench structure 52.

The inversion of the overall tensions allows a design of the layer thicknesses of the dielectric structure 42 and the trench 52 in mutual opposition and/or dependency. Thus, the design can be aimed at realizing the trench(es) with a depth 45 as great as possible, such that an overall tension of the dielectric structure 42 induced outside the trench(es) 52 with respect to the semiconductor substrate 41 in relation to an overall tension induced in the one or several trenches 52 can be neglected. One or several layer thicknesses $d_1$ and/or $d_2$ or layer materials for obtaining an intended (continuous) operating or breakdown voltage of the capacitors can result in an amended trench depth 45 and vice versa.

The dielectric layer 44 has a thickness $d_1$. The dielectric layer 46 has a thickness $d_2$. If the first dielectric layer 44 comprises, for example, silicon oxide, the thickness $d_1$ can have a value of at least or more than 250 nm, more than 300 nm or more than 330 nm. The thickness $d_2$ can have, for example, a value of at least 400 nm, at least 600 nm or at least 1000 nm. Alternatively, the thickness $d_2$ can also be selected in a ratio to the thickness $d_1$. The thickness $d_2$ can be selected, for example with two times, three times or four times or other thickness in relation to the thickness $d_1$. This allows, for example, reduction or compensation of mechanical tensions with increasing layer thickness $d_1$, which can also result in an increasing layer thickness $d_2$.

A maximum layer thickness of the dielectric structure 42 can be limited by a layer thickness of a dielectric layer without compensation of the material tensions and/or by a topography (for example a width 53) of the trench structure 52. An increasing layer thickness can result in a reduction of the surface of the dielectric structure by increasingly "filling" the trench. Thereby, the area covered by the electrode material 48 is also reduced. This results in an again reduced surface enlargement and a lower capacitance of the capacitor 40. In an extreme case that is to be avoided, the dielectric structure 42 has, for example, an overall thickness corresponding to half a "width" of the trench structure 52. Then, the trench structure 52 is closed by the dielectric structure along a direction of the width 53. Put simply, the electrode material would be disposed as planar layer resulting in a capacitance that is smaller than in a completely planar arrangement of the layers. Here, the term "width" relates to a lateral expansion of the trench structure 52 perpendicular to a thickness direction and can, depending on the implementation of the trench structure 52, also be related to a length, i.e. another direction and/or a diameter of the trench structure 52.

An overall thickness of the dielectric structure 42, i.e. of the layer stack, can, for example, be 800 nm, 1000 nm, 1200 nm or more. A layer thickness ratio between an oxide layer and a nitride layer when the dielectric structure 42 includes these layers can, for example, be at a ratio of 0.2 to 1, this means the dielectric layer (nitride) 46 has a thickness of 100% to 500% of the dielectric layer 44 (oxide).

According to an embodiment, a first layer thickness, for example the silicon nitride layer, can be lower or equal to the second layer thickness, for example the silicon oxide layer. This means that the first dielectric layer and the second dielectric layer are formed such that the first layer thickness is at least 0.4 times and at most 1 times the second layer thickness. Alternatively, the first layer thickness can be at least 0.5 times or at least 0.6 times and at most 0.99 times the second layer thickness.

According to embodiments, the first layer thickness can also be greater than the second layer thickness, independent of the materials. This means that the first dielectric layer and the second dielectric layer are formed such that the first layer thickness is at least 0.4 times and at most 1.5 times the second layer thickness. Alternatively, the first layer thickness can be at least 0.5 times and at the most 1.3 times or at least 0.6 times and at the most 1.1 times the second layer thickness. A ratio of the layer thicknesses to one another can be selected based on the obtained material tensions for limiting bending of the substrate within processable limits.

An oxide layer can, for example, have a negative thermal stress and a positive intrinsic stress on a silicon substrate or induce the same, which can have orders of 100 MPa, 200 MPa or 300 MPa along a respective positive or negative direction. Silicon nitride can have positive thermal stress and positive intrinsic stress, for example on a silicon substrate, which means both stress types are rectified. Here, positive stress refers to a mechanical tensile stress by the deposited layer, which results in a convex bending when depositing on the top of a substrate. Accordingly, negative stress refers to mechanical compressive stress by the deposited layer which results in a concave bending during deposition on top of a substrate.

FIG. 5 shows a schematic side sectional view of a capacitor 50, wherein compared to the capacitor 40, a dielectric structure 42' includes a third dielectric layer 62. The third dielectric layer 62 has a temperature coefficient $\alpha_3$, an intrinsic material tension $\sigma_3$ and a dielectric constant $\varepsilon_3$ differing from the temperature coefficients $\alpha_1$ and/or $\alpha_2$, the intrinsic material tensions $\sigma_1$ and/or $\sigma_2$ or the dielectric constants $\varepsilon_1$ and/or $\varepsilon_2$. The coefficient of thermal expansion $\alpha_3$ results in a thermally induced material tension $\Delta_3$. A thickness $d_3$ of the third dielectric layer 62 can be selected based on intrinsic material tensions of layers 4, 46 and 62 and/or based on the thermal expansion behavior or the overall tension of the respective different layers as well as the substrate 41. By disposing a nitride layer on an oxide layer, a so-called "ON" (oxide nitride) stack can be obtained. Disposing a further oxide layer on the nitride layer can enable a so-called "ONO" (oxide nitride oxide) stack.

FIG. 6 shows a section of a schematic side sectional view of a capacitor 60, wherein the second dielectric layer 46 of the dielectric structure 42 is formed by means of two partial layers 46a and 46b. The partial layer 46a can be obtained by means of step 220. The second partial layer 46b can be obtained by means of performing step 240. The electrode material completely "fills" a volume of the trench structure 52 which has not been filled by the dielectric layers 44 and 46.

FIG. 7a shows a schematic side sectional view of an intermediate product of a method for producing a capacitor 70, where a dielectric structure 42a is formed on a first main side surface of the semiconductor substrate 41 and a dielectric structure 42 on a second main side surface. Starting from the semiconductor substrate 41, the dielectric structures 42a and 42b include the same dielectric layers. This can be performed by means of simultaneous processing of the two main sides (for example top and bottom) of the semiconductor substrate 41, for example in an oven, wherein both sides are oxidized simultaneously or deposition is performed.

A trench structure 52a is integrated in a top of the semiconductor substrate 41. A trench structure 52b is integrated in a bottom of the semiconductor substrate 41. The trench structures 52a and 52b are arranged at a distance $\Delta x$ to one another along a lateral direction x of the semiconductor substrate 41. The distance $\Delta x$ can have any value zero. If the distance $\Delta x$ is, for example, zero, i.e. if the trench structures 52a and 52b are arranged opposite to one another, deformation of the semiconductor substrate 41 induced by material recesses of the semiconductor substrate 41 in the trench structures 52a and 52b can at least be partly compensated based on a symmetrical and opposing deformation. A lateral distance $\Delta x$ of more than zero can also allow at least a partial compensation of these deformation effects and further allows that a minimum thickness $\Delta y$ of the semiconductor substrate 41 is increased compared to a situation where the distance $\Delta x$ is zero (remaining thickness of the semiconductor substrate between the trench structures 52a and 52b becomes minimal) and the recesses of the trench structures 52a and 52b are arranged opposite to one another. A distance $\Delta x$ of unequal 0 enables increased fracture strength and improved heat dissipation of the capacitors since a thickness of the semiconductor substrate 41 is increased compared to a distance $\Delta x=0$.

Put simply, the capacitor 70 has trench structures 52a and 52b on both main surfaces. Alternatively, the dielectric structure 42b can also have other layers than the dielectric structure 42a and/or layer thicknesses of the dielectric layers can have differing layer thicknesses. While the trench structures 52a and 52b are illustrated as being the same, number, depth or type of the trenches can differ.

FIG. 7b shows a schematic top view of a wafer 72 prior to separation of the individual components or prior to dicing. The wafer 72 comprises the semiconductor substrate 41 and a plurality of capacitors 70. On the wafer 72, the capacitors 70 each form a capacitor area. The dielectric layers illustrated in FIG. 7a are formed across the plurality of capacitors 70 (together) and possibly across gaps between the capacitor areas. Bending of the wafer 72 during formation of the capacitors 70 is reduced based on the opposing material tensions.

FIG. 8 shows exemplarily a possible curve of a bending of a wafer (semiconductor substrate) during production of capacitors as obtained, for example, by method 100.

A radial distance from a center of the wafer is plotted on an abscissa of the graph. The wafer has, for example, a diameter of 150 mm, such that the radial distance has a value between −75 mm and +75 mm. Wafer bending is plotted on an ordinate of the graph.

A first curve characteristic 82 shows bending of the wafer after disposing a first dielectric layer on the semiconductor substrate ("after oxidation"), possibly by means of step 210 or 310. Disposing can be performed, for example, by oxidation, alternatively also by depositing the layer. A trench structure can be realized, for example, by means of holes having a depth of 20 μm arranged in a hexagonal grid. The holes can have, for example, a diameter of 5.5 μm and a distance of 7 μm between the hole centers, wherein also other diameters and/or distances or another implementation of the trench structure are possible. Exemplarily, disposing the first dielectric layer results, for example, in a bending of the wafer (semiconductor disc) with a height of approximately 100 μm referred to as concave (alternatively convex), wherein the height relates to a maximum bending starting from the center.

A curve characteristic 84 shows bending after deposition of a second dielectric layer on the first dielectric layer is performed ("after nitride deposition"). The second dielectric layer includes, for example, silicon nitride. Mechanical tensions of the second dielectric layer counteract mechanical tensions of the first dielectric layer, such that the concave deformation is reduced to a convex deformation in a range of approximately 20 µm. The first dielectric layer has, for example, a thickness of 330 nm. A thickness of the second dielectric layer is, for example, 500 nm. This can have the effect that the mechanical tensions of the layer almost completely compensate each other and the semiconductor disc only has very little bending.

A curve characteristic 86 shows the bending of the wafer after deposition of the electrode material ("after poly deposition"), for example by means of step 130, for example by disposing polysilicon. Deposition can be performed, for example, in a temperature range between 500° C. and 600° C., between 550° C. and 590° C. or at approximately 570° C. and results in an additional convex bending.

A curve characteristic 88 shows the bending of the wafer after removing the dielectric materials of the dielectric structure from the rear (R) of the semiconductor substrate ("after etching free R"). Removing the materials results in reduced compensation of the material tensions that the dielectric structure allows with regard to an average thickness of the semiconductor substrate. The removed canceled induced material tensions at the front and rear allow the reduction of induced material tensions at the front. This means that deflection of the wafer (bending) increases. In other words, depositing the electrode material 86 of in situ doped polysilicon results in an additional convex bending increased further by removing the layer stack from the rear of the disc (88). After that step, bending of the semiconductor disc can be at a maximum and be, for example, 210 µm in the above example.

A curve characteristic 92 shows bending of the wafer after metallization of the dielectric structure, for example by means of step 140 and after structuring the polysilicon material ("after metallization and poly-etching"), possibly for electrical separation of the individual capacitors from one another in preparation of an electric measurement on wafer level (wafer prober) and/or for preparing the mechanical separation in this step 160 or as part thereof. Interrupting the polysilicon layer results in a partial interruption of the material tension of this layer. The curve characteristic 92 shows a bending of approximately 0 µm. In other words, after the metallization of the capacitor areas after the previous steps on the disc front, the polysilicon layer can be removed between the devices, for example, re-etched, whereby this layer is interrupted and the bending is reduced again to the previous, i.e. original, level.

Step 140 and step 150 of the method 100 can thus be performed in any order. Either metallization or forming an electric terminal can be performed first, and subsequently material can be removed from the rear of the wafer, or, first, the material can be removed and subsequently the metallic contact can be formed. Alternatively, removing the material from the rear of the disc can also be omitted.

A nominal voltage of the generated devices on the semiconductor disc can be more than 300 Volt, for example 400 Volt. An integration density of the devices can, for example, be 0.5 nF/mm$^2$, which can correspond to a surface enlargement of 8.8. Here, the surface enlargement relates to a capacity value that would be obtained without disposing the trench structures with identical layer thickness of the dielectric layers.

By reducing a maximum bending of the wafer during the production process, usage of wafers having greater diameters (approx. 200 mm, 300 mm or more instead of 150 mm) becomes possible, since a bending increasing (possibly with the square) with a diameter can be maintained below critical values, even for increased wafer diameters.

FIG. 9 shows a schematic illustration of different bendings of the wafer, where compared to the illustrations in FIG. 8, the second dielectric layer is implemented approximately twice as thick and is formed by means of two substeps as described for the method 200. In the first substep, for example, approximately 500 nm silicon nitride and in the second substep for example 580 nm silicon nitride are deposited. Deposition of the first partial layer is illustrated in a curve characteristic 84*a* ("after 1$^{st}$ nitride deposition"), essentially corresponding to the curve characteristic 84 in FIG. 8. The increased layer thickness of the second dielectric layer, i.e. the second silicon nitride layer results in a further convex bending of the disc as indicated by a curve characteristic 84*b* ("after 2$^{nd}$ nitride deposition"), such that the same has a maximum value of approximately 250 mm during the whole process. The increased layer thickness results in respective stronger bending in the curve characteristics 86, 88 and 92, which is induced at least partly by overcompensation of the material tensions of the first dielectric layer.

After structuring the polysilicon layer (curve characteristic 92), the maximum bending is reduced to approximately 200 µm.

An overall thickness of the dielectric can, for example, be approximately 1400 nm (333 nm silicon oxide and 1080 nm silicon nitride). Thus, a thickness ratio of the oxide layer and the nitride layer has a value of approximately 1:3.

This can result in a reliable nominal voltage of the capacitor of 600 V or more. A thicker implementation of the first dielectric layer and/or the second dielectric layer and/or disposing a further dielectric layer allows a thicker or thinner physical overall thickness by maintaining the maximum wafer bending, such that even higher nominal voltages of 650 V, 700 V or more can be obtained. Capacitors or RC elements produced with the method 100 can have a capacitance of, for example, 0.2 nF/mm$^2$, 0.3 nF/mm$^2$, 0.4 nF/mm$^2$ or more and a surface enlargement of, for example ≥5, ≥6, ≥7 (for example 7.4) or more with a simultaneously high dielectric strength of, for example, significantly more than 45 V, for example at least 48 V, at least 100 V or at least 300 V. An obtainable surface enlargement is based on the dielectric strength of the dielectric structure, i.e. a thickness of the dielectric.

A layout criterion of trench structures and dielectric layers can include, for example, an initial determination of a greatest possible bending of the semiconductor disc, where a greatest possible area enlargement is performed, wherein maximum bending is influenced by the dielectric layers.

FIG. 10 shows a schematic perspective view of a bending of a silicon wafer with a diameter of 150 mm according to the prior art. The silicon wafer is implemented such that the same comprises trench structures having a tenfold surface enlargement. Further, the wafer comprises a dielectric structure of a first silicon oxide layer of 20 nm thickness and a second silicon nitride layer of 1050 nm thickness corresponding to an effective layer thickness $d_{CET}$ of approximately 566 nm. This results in a theoretical operating voltage of approximately 400 Volt. Maximum bending of such a wafer is approximately 770 µm along the thickness direction y out of an x/z-plane where the wafer is disposed. Compared to these bendings, FIGS. 8 and 9 show a significantly lower bending of the semiconductor disc from 770

μm to 300 or 250 μm. This allows subsequent surface passivation by means of polyimide including a lithography step for structuring the same.

In other words, matching at least two dielectric layers to one another allows that disc bending to all relevant points of the production process does not exceed maximum allowable bending. This can in particular mean that after finishing the capacitors or forming the same in a wafer, bending of the semiconductor disc is less than 300 μm or 250 μm as illustrated in FIGS. 8 and 9. The maximum allowable bending can be determined based on used semiconductor production devices and can be, for example, in a range of approximately 250 μm to 500 μm for commercial application of the production method. From the field of semiconductor foundries (intermediate product producer) partly, values of maximal 150 μm are known, such that maximum bending is to remain below this value. Thus, the above stated embodiments are also of relevance in this field.

As an alternative to the above described methods of the capacitors, other materials and other process steps can be used for producing the dielectric layers of the dielectric structure. A silicon oxide layer, for example, can also be performed by moist, i.e. wet thermal oxidation or thermal oxidation performed by means of hydrogen peroxide combustion. Alternatively, a silicon oxide layer or other layers can also be disposed by means of CVD deposition, for example of tetraethyl orthosilicate (TEOS) and/or as high temperature oxide—HTO/low temperature oxide—LTO). Differing materials, for example also so-called high K dielectrics, i.e. dielectrics having a high dielectric constant can be used as dielectric layers. These are, for example, titanium oxide, tantalum oxide, hafnium oxide, aluminum oxide or lanthanum oxide and further mixed oxides, such as hafnium aluminum oxide.

For keeping the maximum disc bending as low as possible during the production process, it can additionally be advantageous to structure electrode material at first on the front before the whole layer stack is removed from the rear. In that way, for example, tension compensated by a layer stack on the rear can be reduced first before the compensating effects are reduced due to the removal.

Finally, by reducing the mechanical bending, higher integration density can be obtained, since the denser arrangement of the 3D structures, i.e., the trench structures, obtains higher surface enlargements. Using a multilayer dielectric where the mechanical tensions of the individual layers compensate each other to a sufficient extent, i.e., such that the wafer bending remains below an upper limit, allows the production of monolithically integrated capacitors or RC elements for higher nominal voltages (e.g., 600 Volt and more) with a higher surface enlargement. Stronger bending of the semiconductor disk due to the thick dielectric layers can be reduced or prevented by this method without necessitating additional compensation structures or layers that reduce the obtainable integration density and increase the production effort.

Monolithically integrated capacitors or RC elements produced by means of the described concept can be used in circuits or power modules as buffer or attenuation capacitances. Further, such devices can be used, for example, in transistors, for example vertical diffused metal oxide semiconductor (VDMOS), trench MOS or IGBT.

The described integrated capacitors 40, 50 or 60 or capacitors produced from the intermediate product 70 can be used, for example, for absorbing electric energy from an energy storage, for example, for implementing a coil(L) capacitor(C), a resistor(R) C or an LCR resonant circuit for switching relief, i.e., for receiving occurring switching peaks in a power switch, for voltage limitation and/or for vibration attenuation in an electric network when the respective capacitor is used for connecting the electric network. Alternatively or additionally, the integrated capacitors can be used for absorbing electrical energy from a source, such as an intermediate circuit capacitor in a voltage converter for voltage stabilization or voltage supply, such as an alternating current (AC)-direct current (DC), an AC-AC, a DC-DC or a DC-AC converter. In other words, such power modules can be used, for example, in inverters for power input in operation inverters for operation control, in DC-converters for power transmission or in switching power supplies.

Alternatively or additionally, usage of one or several of the integrated capacitors as coupling capacitor or in a power module together with the power switches on a transfer substrate is also possible, wherein the integrated capacitor is mounted on the transfer substrate with the power switches. Alternatively or additionally, it is also possible to implement one or several integrated capacitors on a lead frame together with one or several power semiconductor devices and to dispose the same in a common package. In other words, the integrated capacitor can be arranged in a package together with a power switch. Alternatively, at least one integrated capacitor can be disposed with a semiconductor device in a common package or in a package of a packaged semiconductor device. When using the same in a power module or in combination with the semiconductor device, the integrated capacitor(s) can be used, for example, as coupling capacitor or as attenuation element (RC snubber).

In other words, bending the semiconductor disk due to the production of thick dielectric layers in monolithically integrated capacitors can be minimized by structuring the dielectric of two or more stacked dielectric layers such that the mechanical tensions of these layers partly or completely compensate each other. Such a multilayer dielectric can be realized, for example, of silicon oxide and silicon nitride. Here, a silicon oxide layer of a respective thickness generates a compressive stress counteracting a tensile stress of the silicon nitride layer. Here, the thickness ratio of the two sides is selected such that the generated mechanical tensions and the resulting bending of the semiconductor disk is reduced to a measure that is sufficiently low for further processing.

Intended higher surface enlargements and/or requirements for increasing the dielectric strength (increasing the operating voltage) result in requirements necessitating a thicker dielectric. An integration density that is as great as possible or attractive can be obtained by disposing a dielectric structure where the mechanical tensions of the dielectric layers compensate each other at least partly.

While some embodiments have been described such that a first dielectric layer including silicon (di)oxide is disposed on the semiconductor substrate and a second dielectric layer including silicon nitride is disposed on the first dielectric layer, wherein the first dielectric layer has a lower layer thickness than the second one, dielectric layers can also be disposed in a different number and/or another order and/or such that the first dielectric layer includes a greater layer thickness than the second dielectric layer.

While some aspects have been described in the context of a device, it is obvious that these aspects also represent a description of the respective method, such that a block or device of an apparatus can also be seen as a respective method step or as a feature of a method step. Analogously, aspects that have been described in the context of one or as a method step also represent a description of a respective block or detail or feature of a respective device.

The above described embodiments merely represent an illustration of the principles of the present invention. It is obvious that modifications and variations of the arrangements and details will be obvious to other people skilled in the art. Thus, it is intended that the invention is merely limited by the scope of the following claims and not by the specific details presented herein based on the description and explanation of embodiments.

What is claimed is:

1. A capacitor being an attenuation element of a power module, the capacitor comprising:
   a dielectric structure in a trench of a semiconductor substrate;
   wherein the dielectric structure comprises a plurality of adjacent dielectric layers comprising opposing mechanical overall tensions;
   wherein a first dielectric layer of the dielectric structure comprises a layer thickness that is greater than 250 nm and wherein a second dielectric layer comprises a layer thickness that is greater than 550 nm.

2. The capacitor according to claim 1, comprising a further trench on a rear of the semiconductor substrate facing away from the main surface area and wherein the first dielectric layer and the second dielectric layer are disposed on the rear.

3. The capacitor according to claim 1, comprising a continuous operating voltage of at least 400 V.

4. The capacitor according to claim 1, wherein, a first dielectric layer of the dielectric structure comprises silicon oxide or silicon dioxide and wherein a second dielectric layer of the dielectric structure comprises silicon nitride.

5. The capacitor according to claim 1, wherein the second dielectric layer has a thickness of 100% to 500% of the first dielectric layer.

6. The capacitor according to claim 1, wherein the dielectric structure comprises at least three adjacent dielectric layers wherein at least one dielectric layer comprises a positive mechanical overall tension and at least one negative mechanical overall tension with respect to the semiconductor substrate.

7. The capacitor according to claim 1, further comprising:
   an electrode material formed on a side of the dielectric structure facing away from the semiconductor substrate along a surface normal of the substrate; and
   an electric terminal forming with the electrode material.

8. The capacitor according to claim 7, comprising less or no material of the dielectric structure at a rear of the semiconductor substrate when compared to a front side, the rear facing away from the front side of the semiconductor substrate comprising the trench.

9. The capacitor of claim 1,
   wherein the dielectric structure is arranged on a front side surface of the semiconductor substrate which is a first main side;
   wherein a first dielectric layer of the dielectric structure comprises silicon oxide or silicon dioxide and comprises a layer thickness that is greater than 250 nm; and wherein a second dielectric layer of the dielectric structure comprises silicon nitride comprises a layer thickness that is greater than 1000 nm;
   wherein the second dielectric layer has a thickness of 100% to 500% of the first dielectric layer;
   an electrode material formed on a side of the dielectric structure facing away from the semiconductor substrate; and an electric terminal formed on the electrode material;
   wherein the dielectric structure is removed on the rear side surface of the semiconductor substrate.

10. A usage of the capacitor according to claim 1.

11. The usage of the capacitor according to claim 10, wherein the same is formed within the power module as attenuation element or coupling capacitor.

12. The usage of the capacitor according to claim 11, wherein the power module with the integrated capacitor is connected to an energy source for absorbing electric energy from a network.

13. The usage of the capacitor according to claim 1, comprising a semiconductor device in a common package.

14. The capacitor according to claim 1, wherein the dielectric structure comprises at least three adjacent dielectric layers forming a layer stack arranged in the trench, the at least three adjacent dielectric layers stacked along a depth direction of the trench.

15. The capacitor according to claim 1, wherein a depth of the trench is greater than a width of the trench; and wherein a depth of the trench is at least 1 µm.

16. The capacitor according to claim 1, wherein a first dielectric layer of the dielectric structure comprises silicon oxide or silicon dioxide and comprises a layer thickness that is greater than 250 nm; and wherein a second dielectric layer of the dielectric structure comprises silicon nitride comprises a layer thickness that is greater than 1000 nm;
   wherein the second dielectric layer has a thickness of 201% to 500% of the first dielectric layer.

17. The capacitor according to claim 1, wherein an integration density of the capacitor is at least 0.5 nF/mm$^2$.

18. The capacitor according to claim 1, wherein a depth of the trench is greater than a width of the trench;
   wherein the depth of the trench is at least 1 µm; and
   wherein a first dielectric layer of the dielectric structure comprises silicon oxide or silicon dioxide and comprises a layer thickness that is greater than 250 nm; and wherein a second dielectric layer of the dielectric structure comprises silicon nitride comprises a layer thickness that is greater than 1000 nm;
   wherein the second dielectric layer has a thickness of 201% to 500% of the first dielectric layer.

* * * * *